United States Patent
Chen

(10) Patent No.: US 11,201,074 B2
(45) Date of Patent: Dec. 14, 2021

(54) SYSTEM AND METHOD FOR SEMICONDUCTOR DEVICE PRINT CHECK ALIGNMENT

(71) Applicant: KLA Corporation, Milpitas, CA (US)

(72) Inventor: Hong Chen, San Ramon, CA (US)

(73) Assignee: KLA Corporation, Milpitas, CA (US)

( * ) Notice: Subject to any disclaimer, the term of this patent is extended or adjusted under 35 U.S.C. 154(b) by 3 days.

(21) Appl. No.: 16/778,607

(22) Filed: Jan. 31, 2020

(65) Prior Publication Data
US 2021/0242059 A1    Aug. 5, 2021

(51) Int. Cl.
*H01L 21/68*    (2006.01)
*G06K 9/62*     (2006.01)
*G06T 7/00*     (2017.01)

(52) U.S. Cl.
CPC .......... *H01L 21/681* (2013.01); *G06K 9/6203* (2013.01); *G06T 7/001* (2013.01); *G06K 2209/19* (2013.01); *G06T 2207/20021* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 10,151,706 B1* | 12/2018 | Bhattacharyya | ........ | H01L 22/12 |
| 2009/0304260 A1* | 12/2009 | Postolov | ............ | G01N 21/9501 382/149 |
| 2011/0213487 A1* | 9/2011 | Wahlsten | ............ | G03F 9/7003 700/104 |
| 2015/0154746 A1 | 6/2015 | Zafar et al. | | |
| 2017/0309007 A1* | 10/2017 | Plihal | ...................... | G06T 7/001 |
| 2018/0328860 A1* | 11/2018 | Suman | ............... | G01N 21/9501 |
| 2019/0139208 A1* | 5/2019 | Chen | ........................ | G06T 7/001 |
| 2019/0139209 A1* | 5/2019 | Lee | .......................... | G06T 7/97 |
| 2019/0362928 A1* | 11/2019 | Inoue | ............... | G01N 21/95607 |

FOREIGN PATENT DOCUMENTS

| | | | | | |
|---|---|---|---|---|---|
| CN | | 108885185 A | * | 11/2018 | ............. G06T 7/174 |
| CN | | 109074644 A | * | 12/2018 | ............. G06T 7/001 |
| JP | | 2004271470 A | | 9/2004 | |
| KR | | 1020170135672 A | | 12/2017 | |

OTHER PUBLICATIONS

PCT International Search Report and Written Opinion for International Application No. PCT/US2021/015147 dated May 26, 2021, 7 pages.

* cited by examiner

*Primary Examiner* — Mohammed Rachedine
(74) *Attorney, Agent, or Firm* — Suiter Swantz pc llo

(57) ABSTRACT

A system includes a controller communicatively coupled to an optical inspection sub-system, the controller configured to: receive training images of a sample; identify alignment targets in the master die; receive a first set of reference images of a first die row of a sample, the first die row including a master die and a first set of reference die; align the first set of reference die to the master die via fine alignment processes to generate a first set of aligned reference images of the first row; receive a second set of reference images of a second die row of the sample; align the second set of reference die to the master die based on the alignment targets and the training images using a course alignment offset value; and align the second set of reference die to the master die via a fine alignment process.

28 Claims, 14 Drawing Sheets

SYSTEM AND METHOD FOR SEMICONDUCTOR DEVICE PRINT CHECK ALIGNMENT

TECHNICAL FIELD

The present invention generally relates to semiconductor wafer fabrication and metrology and, more particularly, to a method and system for improved print check alignment of semiconductor device reference images and training images.

BACKGROUND

The fabrication of semiconductor devices, such as logic and memory devices, typically includes processing a semiconductor device using a large number of semiconductor fabrication and metrology processes to form various features and multiple layers of the semiconductor devices. Some fabrication processes utilize photomasks/reticles to print features on a semiconductor device such as a wafer. As semiconductor devices become smaller and smaller laterally and extended vertically, it becomes critical to develop enhanced inspection and review devices and procedures to increase sensitivity and throughput of wafer and photomask/reticle inspection processes.

Semiconductor devices may develop defects during the fabrication processes. Inspection processes are performed at various steps during a semiconductor manufacturing process to detect defects on a sample. Inspection processes are an important part of fabricating semiconductor devices such as integrated circuits. These inspection processes become even more important to successfully manufacture acceptable semiconductor devices as the dimensions of semiconductor devices decrease. Detection of defects has become highly desirable as the dimensions of semiconductor devices decrease, as even relatively small defects may cause unwanted aberrations in the semiconductor devices.

Detecting defects may require accurate alignment of reference images and test images of a semiconductor device via an image alignment process. The image alignment process may include measuring the offset between the reference images and the test images and shifting the reference images and/or the test images by the measured offsets. However, conventional alignment techniques (e.g., conventional print check techniques) typically require multiple scans to properly align multiple reference die to a master die. Additionally, conventional alignment techniques only work for single-reticle reference cases in standard reference die (SRD). Furthermore, these conventional alignment techniques are not robust in that they may fail to properly align images within acceptable alignment thresholds.

Therefore, it would be desirable to provide a system and method which cures one or more of the shortfalls of previous approaches identified above.

SUMMARY

A system is disclosed. In embodiments, the system includes a controller communicatively coupled to an optical inspection sub-system, the controller including one or more processors configured to execute a set of program instructions stored in memory, the set of program instructions configured to cause the one or more processors to: receive one or more training images of a sample, the sample including a master die; identify one or more alignment targets in the master die and store the one or more alignment targets in memory; receive a first set of one or more reference images of a first die row of a sample, the first die row including a master die and a first set of one or more reference die; align the first set of one or more reference die to the master die via one or more fine alignment processes to generate a first set of one or more aligned reference images of the first row; receive a second set of one or more reference images of a second die row of the sample, the second die row including a second set of one or more reference die; align the second set of one or more reference die to the master die based on the alignment targets and the one or more training images using a course alignment offset value; and align the second set of one or more reference die to the master die via a fine alignment process to generate a second set of one or more aligned reference images of the second die row.

A system is disclosed. In embodiments, the system includes an optical inspection sub-system configured to acquire images of a sample. The system may further include a controller communicatively coupled to the optical inspection sub-system, the controller including one or more processors configured to execute a set of program instructions stored in memory, the set of program instructions configured to cause the one or more processors to: receive one or more training images of a first sample from the optical inspection sub-system, the first sample including a master die; identify one or more alignment targets in the master die and store the one or more alignment targets in memory; receive a first set of one or more reference images of a first die row of a second sample from the optical inspection sub-system, the first die row including a master die and a first set of one or more reference die; align the first set of one or more reference die to the master die via one or more fine alignment processes to generate a first set of one or more aligned reference images of the first row; receive a second set of one or more reference images of a second die row of the second sample from the optical inspection sub-system, the second die row including a second set of one or more reference die; align the second set of one or more reference die to the master die based on the alignment targets and the one or more training images using a course alignment offset value; and align the second set of one or more reference die to the master die via a fine alignment process to generate a second set of one or more aligned reference images of the second die row.

A method is disclosed. In embodiments, the method includes: acquiring one or more training images of a sample, the sample including a master die; identifying one or more alignment targets in the master die and storing the one or more alignment targets in memory; acquiring a first set of one or more reference images of a first die row of a sample, the first die row including a master die and a first set of one or more reference die; aligning the first set of one or more reference die to the master die via one or more fine alignment processes to generate a first set of one or more aligned reference images of the first row; acquiring a second set of one or more reference images of a second die row of the sample, the second die row including a second set of one or more reference die; aligning the second set of one or more reference die to the master die based on the alignment targets and the one or more training images using a course alignment offset value; and aligning the second set of one or more reference die to the master die via a fine alignment process to generate a second set of one or more aligned reference images of the second die row.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1:
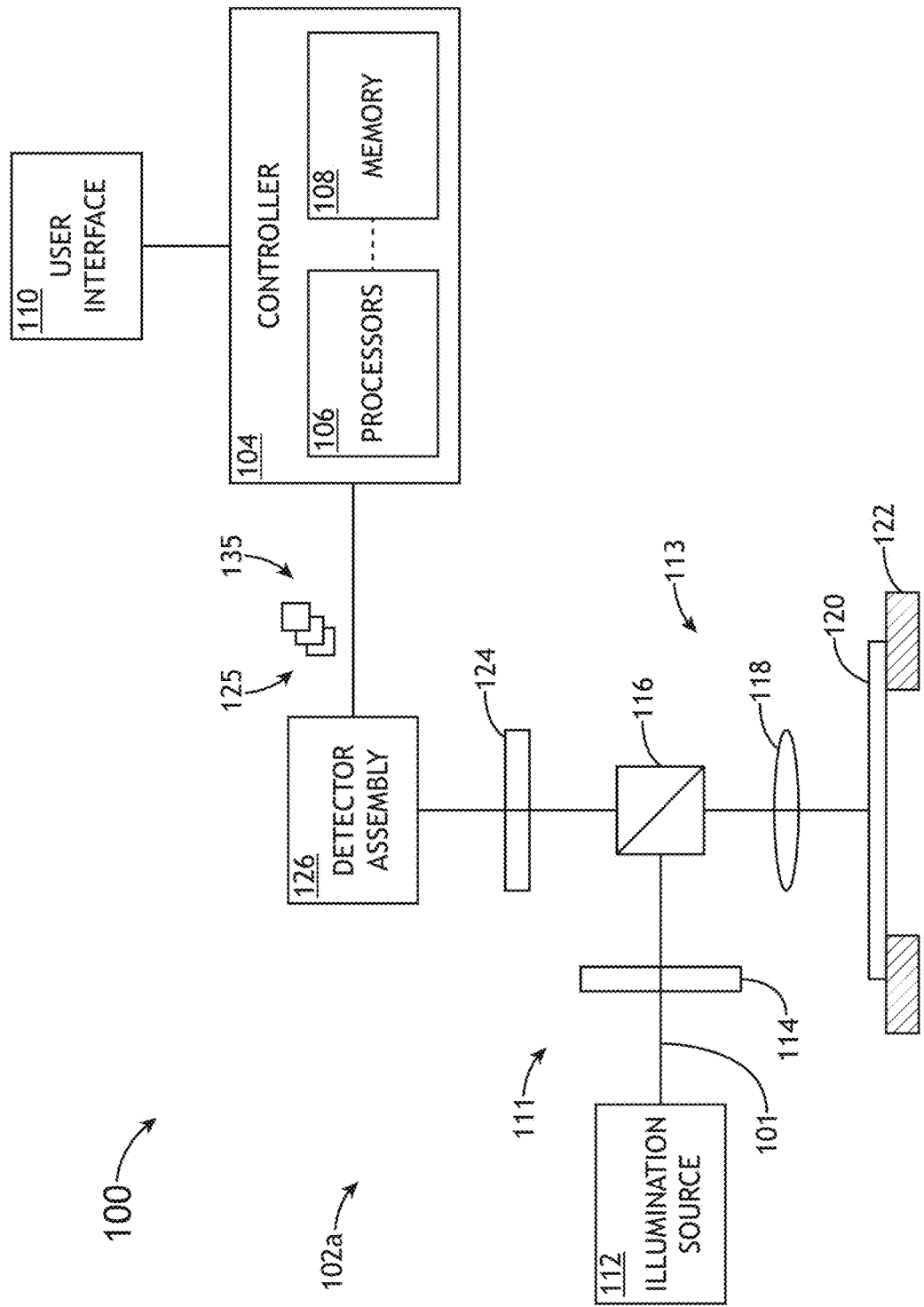
FIG. 1 illustrates a system for performing print check alignment on images of semiconductor devices, in accordance with one or more embodiments of the present disclosure.

Reference will now be made in detail to the subject matter disclosed, which is illustrated in the accompanying drawings.

Referring generally to FIGS. 1-11, a system and method for performing print check alignment on images of semiconductor devices are described, in accordance with one or more embodiments of the present disclosure.

Detecting defects may require accurate alignment of reference images and test images of a semiconductor device via an image alignment process. The image alignment process may include measuring the offset between the reference images and the test images and shifting the reference images and/or the test images by the measured offsets. Conventional broadband plasma (BBP) inspection may be used to identify sample defects created during fabrication of the sample, and may be configured to align different dies on the sample from the same scan, within the same swath. For print check, alignment must be performed across different scans and different swaths and may even be required between separate samples.

As extreme ultraviolet (EUV) lithography is being actively used in production to fabricate sub-7 nm design rule devices, inspection of EUV mask/reticle becomes increasingly important. Typically, optical reticle-inspection tools are used to inspect EUV masks. However, if there is a pellicle on the EUV mask/reticle which is non-transmissive to the optical wavelengths used in the existing reticle inspection tools, then there is a need for alternative inspection methodologies based on inspection of printed samples. The printed wafer inspection methodology may sometimes be referred to as "Reticle Print Check."

Reticle Print Check is a BBP inspection solution for EUV mask monitoring through printed wafer inspection. Some Reticle Print Check techniques have used a two-step inspection/alignment process including a coarse alignment process and a fine alignment process. This coarse and fine alignment approach may sometimes be utilized in SRD+20 nm which is aimed to detect repeater defects above 20 nm. In SRD+20 nm train, reference dies are saved from one die row. Subsequently, print check 10 nm may be utilized to detect repeater defects above 10 nm.

However, these conventional alignment techniques typically utilize die-to-die alignment from the same scan, within the same swath to perform alignment. Accordingly, these conventional alignment techniques (e.g., conventional print check techniques) typically require multiple scans to properly align multiple reference die to a master die. To detect smaller repeater defects, one of the challenges is to save multiple reference dies from multiple die rows (e.g., multiple scans, multiple swaths) during print check single die reticle (SDR) train. Furthermore, these conventional alignment techniques are not robust in that they may fail to properly align images within acceptable alignment thresholds.

Accordingly, embodiments of the present disclosure are directed to a system and method which cure one or more of the shortfalls of the previous approaches identified above. Embodiments of the present disclosure are directed to a system and method which may align multiple reference dies from multiple dies to a master die in a single scan during train. During a single scan, embodiments of the present disclosure may be able to identify, align, and save master die and reference die from multiple die rows. Additional embodiments of the present disclosure are directed to utilizing a single coarse alignment offset value in order to align a plurality of reference die to the master die within sufficient coarse alignment thresholds.

It is contemplated herein that the system and method of the present disclosure may enable print check alignment to be carried out within a single scan. Embodiments of the present disclosure may also improve coarse alignment processes by enabling more robust alignment in print check for both single-die reticle (SDR) and multi-die reticle (MDR) use cases. Furthermore, it is contemplated herein that embodiments of the present disclosure may reduce scan-to-scan variation.

FIG. 1 illustrates a system 100 for performing print check alignment on images of semiconductor devices, in accordance with one or more embodiments of the present disclosure. In particular, FIG. 1 illustrates a system 100 for aligning semiconductor device training images 125 and reference images 135.

In embodiments, the system 100 may include an optical characterization sub-system 102. The optical inspection sub-system 102 may include any optical-based inspection/characterization system or tool known in the art including, but not limited to, an image-based metrology tool, a review tool, and the like. For example, the inspection sub-system 102 may include an optical dark-field inspection tool and/or an optical bright-field inspection tool. The optical inspection sub-system 102 may include, but is not limited to, an illumination source 112, an illumination arm 111, a collection arm 113, and a detector assembly 126.

In one embodiment, optical inspection sub-system 102 is configured to inspect and/or measure the sample 120 disposed on the stage assembly 122. Illumination source 112 may include any illumination source known in the art for generating illumination 101 including, but not limited to, a broadband radiation source (e.g., Xenon lamp, a laser-sustained plasma (LSP) illumination source), a narrowband illumination source (e.g., laser illumination source), and the like. The illumination source 112 may be configured to generate DUV, UV, VUV, and/or EUV illumination. For instance, the EUV illumination source may include a discharge produced plasma (DPP) illumination source or a laser produced plasma (LPP) illumination source configured to generate illumination in the EUV range. By way of another example, the illumination source 112 may be configured to generate X-ray radiation. In another embodiment, the illumination source 112 may be operably coupled to a set of positioners configured to actuate the illumination source 112 in one or more directions. For example, a controller 104 may direct the set of positioners to translate the illumination source 112 in one or more of an X-direction, a Y-direction, and/or a Z-direction to correct beam misalignment produced by any of the components of the system 100.

In another embodiment, optical inspection sub-system 102 may include an illumination arm 111 configured to direct illumination 101 to the sample 120. It is noted that illumination source 112 of optical inspection sub-system 102 may be configured in any orientation known in the art including, but not limited to, a dark-field orientation, a light-field orientation, and the like. For example, the one or more optical elements 114, 124 may be selectably adjusted in order to configure the inspection sub-system 102 in a dark-field orientation, a bright-field orientation, and the like.

Sample 120 may include any sample known in the art including, but not limited to, a wafer (e.g., semiconductor wafer), a reticle, a photomask, and the like. As used through the present disclosure, the term "wafer" refers to a substrate formed of a semiconductor and/or a non-semiconductor material. For instance, in the case of a semiconductor material, the wafer may be formed from, but is not limited to, monocrystalline silicon, gallium arsenide, and/or indium phosphide. In another embodiment, the sample 120 includes a photomask/reticle. As such, the terms "wafer," "sample," and "sample" may be used interchangeably in the present disclosure. Therefore, the above description should not be interpreted as a limitation on the scope of the present disclosure but merely an illustration.

In one embodiment, sample 120 is disposed on a stage assembly 122 to facilitate movement of sample 120. In another embodiment, the stage assembly 122 is an actuatable stage. For example, the stage assembly 122 may include, but is not limited to, one or more translational stages suitable for selectably translating the sample 120 along one or more linear directions (e.g., x-direction, y-direction and/or z-direction). By way of another example, the stage assembly 122 may include, but is not limited to, one or more rotational stages suitable for selectively rotating the sample 120 along a rotational direction. By way of another example, the stage assembly 122 may include, but is not limited to, a rotational stage and a translational stage suitable for selectably translating the sample 120 along a linear direction and/or rotating the sample 120 along a rotational direction. It is noted herein that the system 100 may operate in any scanning mode known in the art.

The illumination arm 111 may include any number and type of optical components known in the art. In one embodiment, the illumination arm 111 includes one or more optical elements 114, a set of one or more optical elements 114, a beam splitter 116, and an objective lens 118. In this regard, illumination arm 111 may be configured to focus illumination 101 from the illumination source 112 onto the surface of the sample 120. The one or more optical elements 114 may include any optical elements known in the art including, but not limited to, one or more mirrors, one or more lenses, one or more polarizers, one or more beam splitters, wave plates, and the like.

In another embodiment, optical inspection sub-system 102a includes a collection arm 113 configured to collect illumination reflected or scattered from sample 120. In another embodiment, collection arm 113 may direct and/or focus the reflected and scattered light to one or more sensors of a detector assembly 126 via one or more optical elements 124. The one or more optical elements 124 may include any optical elements known in the art including, but not limited to, one or more mirrors, one or more lenses, one or more polarizers, one or more beam splitters, wave plates, and the like. It is noted that detector assembly 126 may include any sensor and detector assembly known in the art for detecting illumination reflected or scattered from the sample 120.

In another embodiment, the detector assembly 126 of the optical inspection sub-system 102 is configured to collect metrology data of the sample 120 based on illumination reflected or scattered from the sample 120. The detector assembly 126 may include any detector assembly known in the art including, but not limited to, photo-multiplier tubes (PMTs), charge coupled devices (CCDs), time-delay integration (TDI) cameras, or the like. In another embodiment, the detector assembly 126 is configured to transmit collected/acquired images (e.g., training images 125, reference images 135) and/or metrology data to the controller 104.

In embodiments, the controller 104 may be communicatively coupled to the various components of the optical inspection sub-system 102. For example, the controller 104 may be operably coupled to the illumination source 112, the stage assembly 122, and/or the detector assembly 126. The controller 104 of system 100 may include one or more processors 106 and memory 108. The memory 108 may include program instructions configured to cause the one or more processors 106 to carry out various steps of the present disclosure. In one embodiment, the program instructions are configured to cause the one or more processors 106 to adjust one or more characteristics of the optical inspection sub-system 102 in order to perform one or more measurements of the sample 120.

In one embodiment, the one or more processors 106 may include any one or more processing elements known in the art. In this sense, the one or more processors 106 may include any microprocessor-type device configured to execute software algorithms and/or instructions. In one embodiment, the one or more processors 106 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 106. In general, the term "processor" may be broadly defined to encompass any device having one or more processing elements, which execute program instructions from memory 108. Moreover, different subsystems of the system 100 (e.g., illumination source 112, detector assembly 126, controller 104, user interface 110, and the like) may include processor or logic elements suitable for carrying out at least a portion of the steps described throughout the present disclosure. Therefore, the above description should not be interpreted as a limitation on the present disclosure but merely an illustration.

The memory 108 may include any storage medium known in the art suitable for storing program instructions executable by the associated one or more processors 106 and the data received from the inspection sub-system 102. For example, the memory 108 may include a non-transitory memory medium. For instance, the memory 108 may include, but is not limited to, a read-only memory (ROM), a random-access memory (RAM), a magnetic or optical memory device (e.g., disk), a magnetic tape, a solid-state drive and the like. It is further noted that memory 108 may be housed in a common controller housing with the one or more processors 106. In an alternative embodiment, the memory 108 may be located remotely with respect to the physical location of the processors 106, controller 104, and the like. In another embodiment, the memory 108 maintains program instructions for causing the one or more processors 106 to carry out the various steps described through the present disclosure.

In one embodiment, a user interface 110 is communicatively coupled to the controller 104. In one embodiment, the user interface 110 may include, but is not limited to, one or more desktops, tablets, smartphones, smart watches, or the like. In another embodiment, the user interface 110 includes a display used to display data of the system 100 to a user. The display of the user interface 110 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 110 is suitable for implementation in the present disclosure. In another embodiment, a user may input selections and/or instructions responsive to data displayed to the user via a user input device of the user interface 110.

As noted previously, the controller 104 of system 100 may include one or more processors 106 configured to execute a set of program instructions stored in memory 108, the set of program instructions configured to cause the one or more processors 106 to carry out various steps/functions of the present disclosure. In one embodiment, the program instructions are configured to cause the one or more processors 106 to adjust one or more characteristics of the optical inspection sub-system 102 in order to perform one or more measurements of the sample 120. By way of another example, the set of program instructions may be configured to cause the one or more processors 106 of the controller 104 to: receive one or more training images of a sample, the sample including a master die; identify one or more alignment targets in the master die and store the one or more alignment targets in memory; receive a first set of one or more reference images of a first die row of a sample, the first die row including a master die and a first set of one or more reference die; align the first set of one or more reference die to the master die on each of the alignment blocks using fine alignment to generate a first set of one or more aligned reference images of the first row; receive a second set of one or more reference images of a second die row of the sample, the second die row including a second set of one or more reference die; align the second set of one or more reference die to the master die based on the alignment targets and the one or more training images using a course alignment offset value; and align the second set of one or more reference die to the master die via a fine alignment process to generate a second set of one or more aligned reference images of the second die row.

Figure 2A:
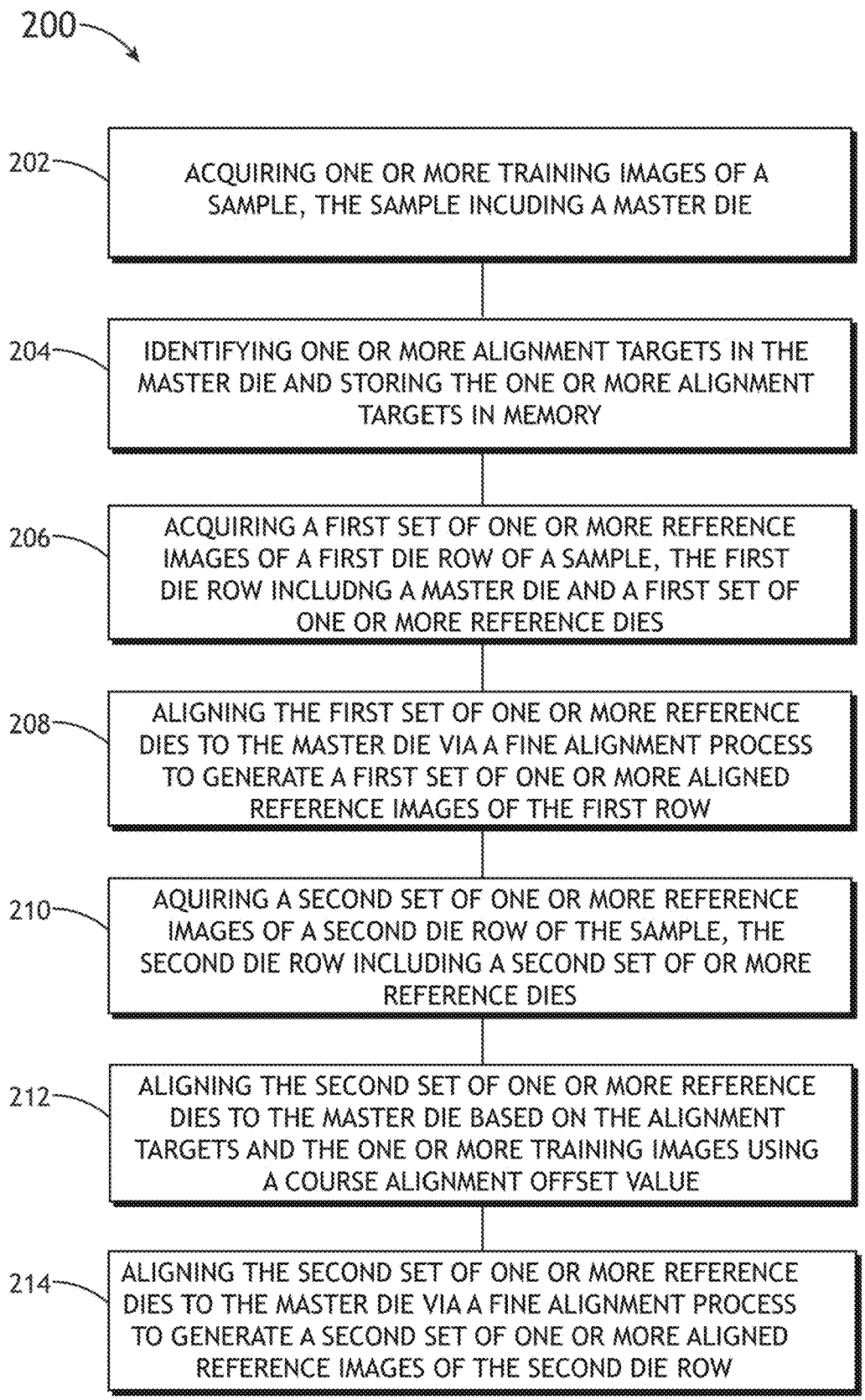
FIGS. 2A-2B illustrate a flowchart of a method for performing print check alignment of images of a semiconductor device, in accordance with one or more embodiments of the present disclosure.
Figure 2B:
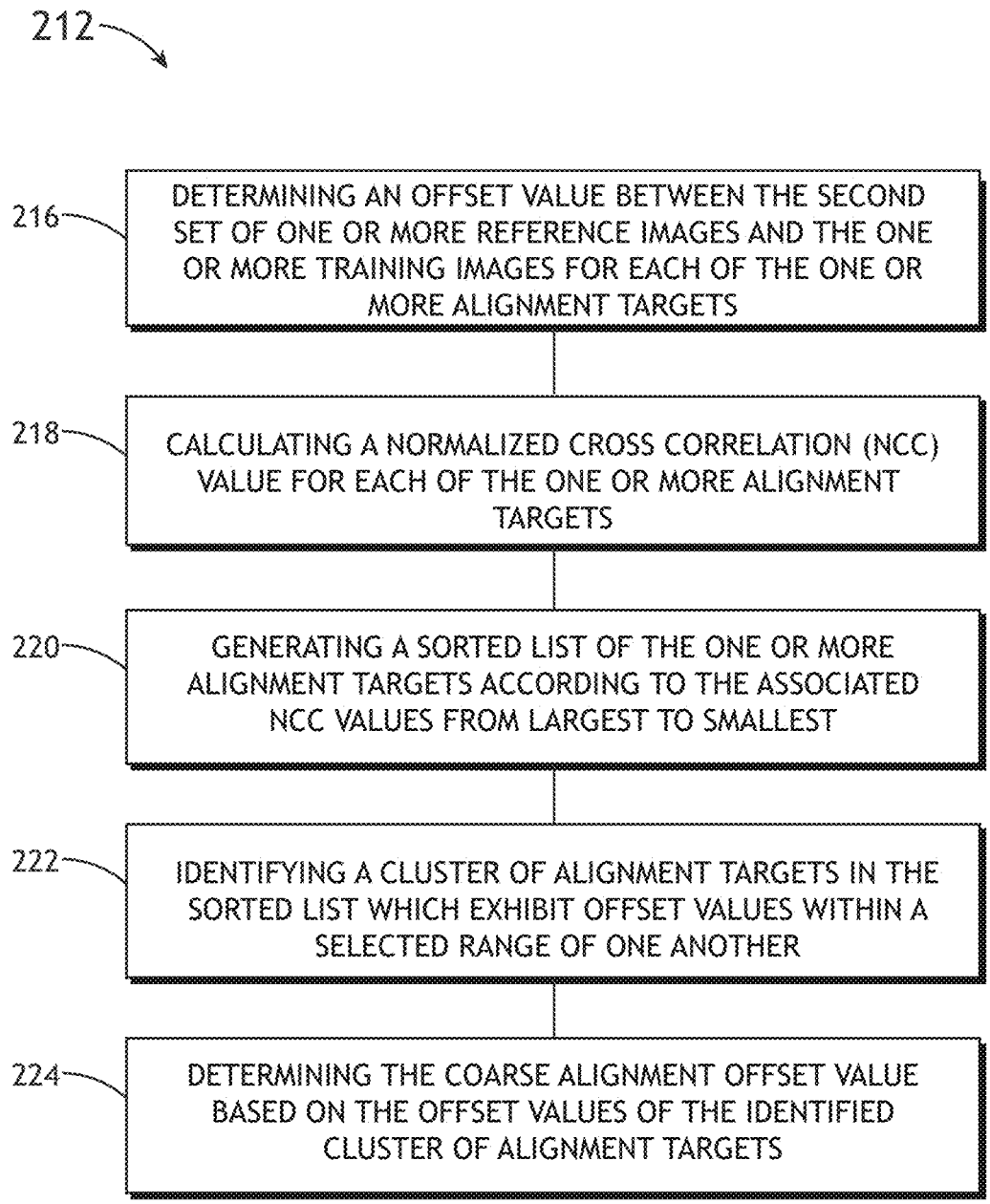

The various steps/functions carried out by the controller 104 may be further shown and understood with reference to FIGS. 2A-2B.

FIGS. 2A-2B illustrate a flowchart of a method 200 for performing print check alignment of images of a semiconductor device (e.g., sample 120), in accordance with one or more embodiments of the present disclosure. It is noted herein that the steps of method 200 may be implemented all or in part by system 100. It is further recognized, however, that the method 200 is not limited to the system 100 in that additional or alternative system-level embodiments may carry out all or part of the steps of method 200.

Figure 3A:
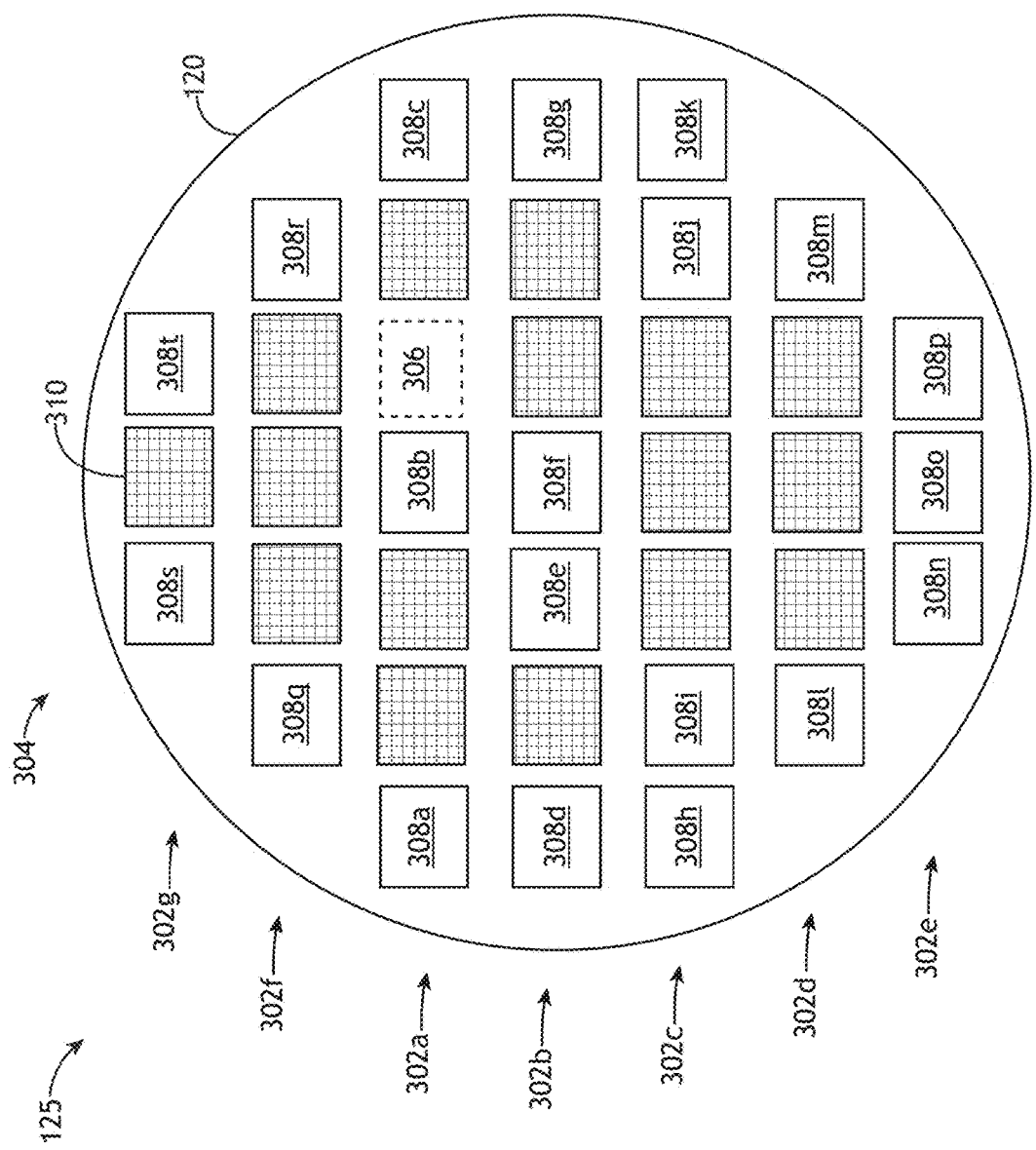
FIG. 3A illustrates a simplified block diagram view of a training image of a sample including a master die and a plurality of reference die, in accordance with one or more embodiments of the present disclosure.

In a step 202, one or more training images 125 of a sample 120 are acquired. For example, FIG. 3A illustrates a simplified block diagram view of a training image 125 of a sample 120. The training image 125 may be received from any source known in the art including, but not limited to, the optical characterization sub-system 102, memory, a network, and the like. For example, the controller 104 may be configured to cause the optical inspection sub-system 102 to acquire one or more training images 125, and may then receive the one or more acquired training images 125 from the optical inspection sub-system 102.

The one or more training images 125 may be acquired during one or more swath scans of the sample 120. For example, a swath scan (swath images) may be obtained via a single left-to-right scan of the sample 120. By way of another example, a swath image may be obtained via a single right-to-left scan of the sample 120. It is noted herein a swath scan includes one or more images of multiple die, for purposes of the present disclosure. In addition, it is noted herein that each die image includes multiple frame images, for purposes of the present disclosure. In embodiments, the one or more training images 125 may include a plurality of die 304 including a master die 306 and a plurality of reference die 308a-308n. The received training images 125 may be stored in memory 108.

The master die 306 may be used in subsequent steps to align each of the reference die 308 to the master die 306. The master die 306 may be selected from the plurality of die 304 manually and/or automatically. For example, the controller 104 may automatically select a die of the plurality of die 304 to be the master die 306. By way of another example, a user may input one or more input commands via user interface 110 to select the master die 306.

As shown in FIG. 3A, the plurality of die 304 may be arranged in any arrangement/configuration known in the art. For example, the plurality of die 304 may be arranged in an array including a plurality of die rows 302a-302e. It is noted herein, however, that the arrangement of die shown in FIG. 3A is provided merely for illustration, and is not to be regarded as limiting.

During SDR train, one die may be selected as a master die, and one or more additional die may be selected as reference die. Accordingly, in embodiments, one die of the plurality of die 304 may be identified or selected as a master die 306. Similarly, one or more additional die may be identified or selected as reference die 308. In some embodiments, each die of the plurality of die 304 which is not the master die 306 (e.g., "non-reference die 310") may be identified/selected as a reference die 308. It is noted herein that any die from any die row 302 may be selected to perform SDR train.

In additional and/or alternative embodiments, as shown in FIG. 3A, only a sub-set of die of the plurality of die 304 may be selected as reference die 308. In some embodiments where the plurality of reference die 304 are arranged in die rows 302, the reference die may be selected such that each die row 302 includes one or more reference die 308. For example, the first die row 302a including the master die 306 may include a first set of one or more reference die 308a, 308b, 308c. Similarly, by way of another example, a second die row 304b adjacent to the first die row 302a may include a second set of one or more reference die 308d-308g.

In a step 204, one or more alignment targets in the master die 306 are identified. It is noted herein that the controller 104 and/or a user (via user interface) may identify the one or more alignment targets automatically and/or manually. The one or more alignment targets may be stored in memory 108. By storing the locations/positions of the one or more alignment targets in memory 108, the alignment targets may be retrieved and utilized for subsequent coarse alignment processes and fine alignment processes.

For example, alignment targets may be used to measure the offset of two images. The alignment targets may include any distinguishable and/or identifiable feature of the sample 120 including, but not limited to, corners and/or locations of high gradient in both the X-direction and the Y-direction. In general, any feature or structure with unique X and/or Y-direction features may be used as alignment targets. In some embodiments, coarse alignment processes may utilize one alignment target per frame when measuring alignment offsets. In another embodiment, the coarse alignment process utilizes a larger search range selected to cover stage uncertainty. It is noted herein that selecting a larger search range to include stage uncertainty may result in fewer targets being qualified for the coarse alignment process. For example, targets are not qualified for offset measurement if they reside in areas of repeating patterns, such as array regions. In this regard, the alignment offsets for the entirety of a swath and/or select zones of a swath may not be sufficiently accurate, as the offsets from sparse targets may not represent the fine image displacement adequately.

After identifying the one or more alignment targets, the controller 104 may be configured to determine the position and/or offsets of each of the reference die 308 relative to the master die 306 based on the identified alignment targets. For example, the controller 104 may be configured to construct a virtual "map" which maps the position of each of the reference die 308 relative to the master die 306. In this regard, the position of each reference die 308 relative to the master die 306 may be determined and saved in memory 108.

In a step 206, a first set of one or more reference images 135 of a first die row 302a of a sample 120 are acquired. The first die row 302a may include the master die 306 and a first set of one or more reference die 308a, 308b, 308c. It is noted herein that the first set of one or more reference die 308a-308c may include any number of reference die 308. The reference images 135 may be received from any source known in the art including, but not limited to, the optical characterization sub-system 102, memory, a network, and the like. For example, the controller 104 may be configured to cause the optical inspection sub-system 102 to acquire one or more reference images 135 and may then receive the one or more acquired reference images 135 from the optical inspection sub-system 102. In some instances, the acquired reference image 135 and the training images 125 may be misaligned. For example, the reference images 135 and the training images 125 may be misaligned due to stage uncertainty, sensor jitter, pixel shifts, or the like. The one or more acquired reference images 135 may be stored in memory.

Figure 3B:
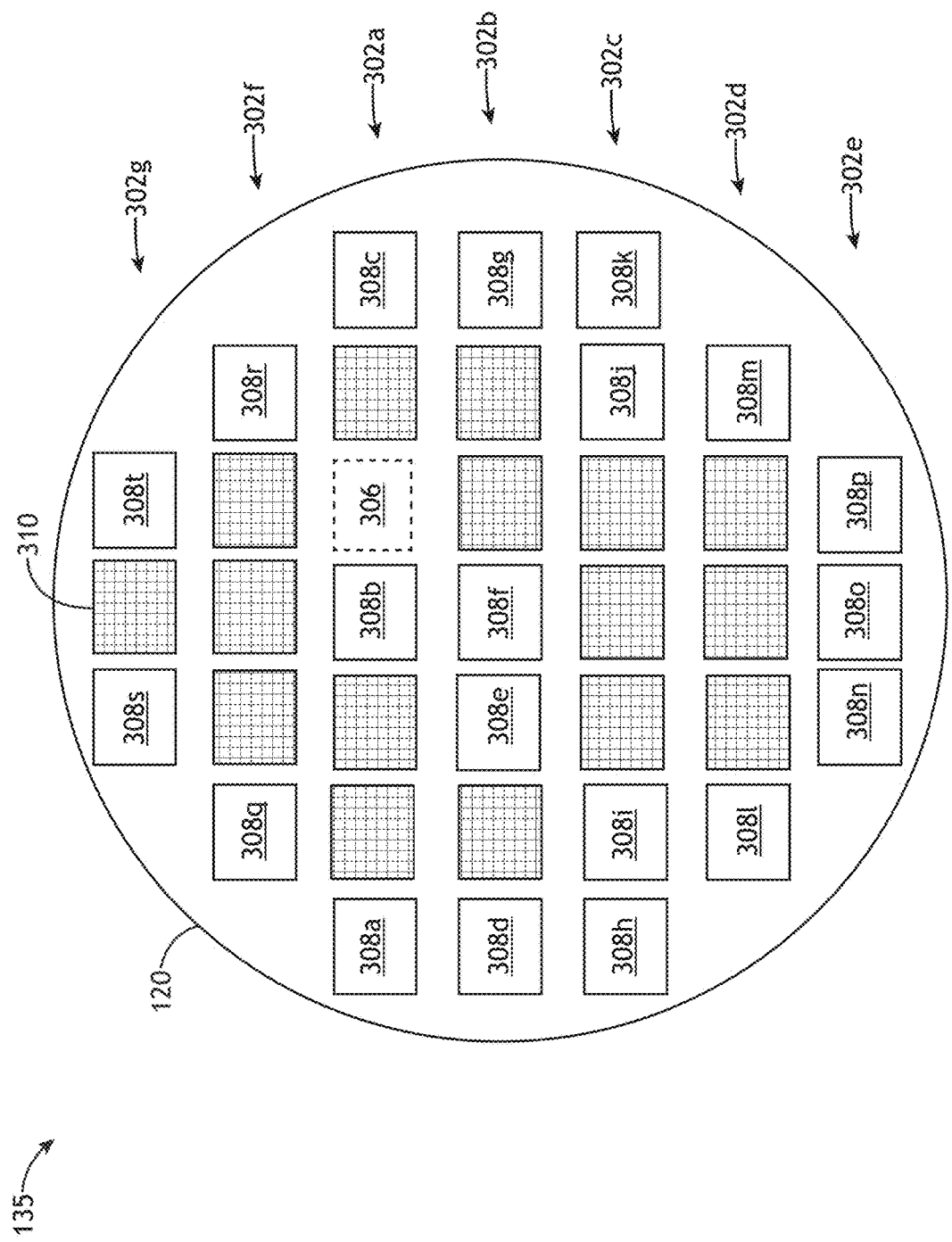
FIG. 3B illustrates a simplified block diagram view of a reference image of a sample including a master die and a plurality of reference die, in accordance with one or more embodiments of the present disclosure.

FIG. 3B illustrates a simplified block diagram view of a reference image 135 of a sample 120 including a plurality of die 304 including a master die 306 and a plurality of reference die 308a-308n, in accordance with one or more embodiments of the present disclosure. It is noted herein that any discussion associated with the training image 125 depicted in FIG. 3A may be regarded as applying to the reference image 135 illustrated in FIG. 3B, unless noted otherwise herein.

In one embodiment, the first set of one or more reference images 135 of the first die row 302a are acquired during one or more swath scans of the sample 120. For example, the first set of one or more reference images 135 of the first die row 302a may be acquired during a single swath scan of the first die row 302a of the sample 120. It is noted herein that the die row 302 including the master die 306 may be identified as the "first die row 302a." Accordingly, the first set of one or more reference images 135 acquired may include one or more reference images 135 acquired during a swath scan of the die row 302 including the master die 306.

For the purposes of the present disclosure, a "scan" of a sample, or portion of a sample, may be performed to inspect the selected area of the sample. In this regard, embodiments of the present disclosure configured to carry out alignment through a "single scan" indicates that any given area of the sample 120 is only scanned/inspected once (with the exception of any swath overlay area to ensure all areas are inspected). To cover all area in one die row 302, a scan with multiple "swaths" may be required. On a BBP inspection tool, a typical swath height may be approximately 8000-9000 pixels. Thus, assuming the pixel size is 50 nm and die height is 30 mm, then seventy-five swaths (30,000,000/(8000*50)=75 swaths) may be required to scan/inspect a total height of a die row.

In some embodiments, a single sample 120 may be used to acquire the training images 125 and the reference images 135. For example, a first set of scans of a sample 120 may be used to acquire the training images 125, and a second set of scans of the sample 120 may be used to acquire the reference images 135. In this example, the sample 120 illustrated in FIG. 3A may include the same sample 120 illustrated in FIG. 3B. In additional and/or alternative embodiments, the training images 125 and subsequent sets of reference images 135 may be acquired based on different samples 120. For example, a first set of scans (e.g., golden reference) of a first sample 120a may be used to acquire the training images 125, and a second set of scans (e.g., scans acquired when performing Standard Reference Die (SRD) inspection) of a second sample 120b may be used to acquire the reference images 135. In this example, the sample 120 illustrated in FIG. 3A may include the first sample 120a, and the sample 120 illustrated in FIG. 3B may include the second sample 120b.

In a step 208, the first set of one or more reference die 308a, 308b, 308c are aligned to the master die 306 via one or more fine alignment processes to generate a first set of one or more aligned reference images 135 of the first die row 302a. The first set of one or more reference die 308a, 308b, 308c may be aligned to the master die 306 based on the alignment targets and the one or more training images 125 to generate the first set of one or more aligned reference images 135. For example, the controller 104 may be configured to align the first set of reference die 308a-308c to the master die 306 within the first set of reference images 135 based on the one or more alignment targets to generate one or more aligned reference images 135. As it is used herein the term "aligned reference images 135" may refer to reference images which have been selectively modified and/or adjusted such that the reference die 308 in the aligned reference images 135 correspond to (e.g., match, line-up with) the respective reference die 308 in the training images 125. In embodiments, the controller 104 may be configured to store the first set of one or more aligned reference images 135 in memory 108.

In embodiments, the controller 104 may be configured to align the first set of one or more reference die 308a-308c to the master die 306 via one or more coarse alignment processes and/or one or more fine alignment processes. Coarse alignment processes may be utilized to align two images (e.g., align reference die 308) to within ±2 pixels, whereas fine alignment processes may be used align two images (e.g., align reference die 308) to within ±0.05 pixels. Fine alignment processes are discussed in further detail by Hong et al. in U.S. patent application Ser. No. 15/837,582, filed Dec. 11, 2017, entitled SYSTEM AND METHOD FOR ALIGNING SEMICONDUCTOR DEVICE REFERENCE IMAGES AND TEST IMAGES, which is incorporated herein by reference in the entirety.

It is noted herein that offsets of die (e.g., reference die 308) within a single die row 302 or swath scan may generally be small (e.g., within approximately ±3 pixels). This offset range is well within the range for fine alignment processes. In this regard, the first set of one or more reference die 308a, 308b, 308c may be aligned to the master die 306 directly with fine alignment processes, and without coarse alignment processes. For example, in some embodiments, step 208 may include aligning the first set of one or more reference die 308a-308c to the master die 306 using one or more fine alignment processes. For instance, the controller 104 may be configured to align the first set of one or more reference die 308a-308c to the master die 306 via a fine alignment process by measuring a plurality of individual offsets of the one or more alignment targets between the first set of one or more reference images 135 and the one or more training images 125. The controller 104 may then be configured to align the first set of reference die 308a-308c to the master die 306 by adjusting the measured individual offsets to correct for distortions between the reference images 135 and the training images 125.

In instances where the offsets of reference die 308 within the first die row 302a is greater than the range for fine alignment processes, step 208 may include aligning the first set of reference die 308a-308c to the master die 306 via one or more coarse alignment processes, followed by one or more fine alignment processes. The one or more coarse alignment processes will be discussed in further detail herein.

In a step 210, a second set of one or more reference images 135 of a second die row 302b of the sample 120 are acquired. For example, the controller 104 may receive/acquire a second set of one or more reference images 135 of the second die row 302b including a second set of one or more reference die 308d, 308e, 308f, 308g. The second set of reference images 135 may be acquired from any image source known in the art including, but not limited to, the optical inspection sub-system 102. In some embodiments, the second die row 302b may be directly adjacent to the first die row 302a, as shown in FIG. 3B. However, this is not to be regarded as a limitation of the present disclosure, unless noted otherwise herein.

In embodiments, the second set of one or more reference images 135 may be acquired during a swath scan of the second die row 302b. For example, in embodiments where training images 125 are acquired during a scan of a first sample 120a, and the first set of reference images 135 are acquired during a first swath scan of a second sample 120b, the second set of reference images 135 may be acquired during a second swath scan of the second sample 120b.

In a step 212, the second set of one or more reference die 308d-308g are aligned to the master die 306 based on the alignment targets and the one or more training images 125 using a course alignment offset value. For example, the controller 104 may be configured to determine a coarse alignment offset value for the second set of reference die 308d-308g based on the alignment targets, and align the second set of reference die 308d-308g to the master die 306 within the second set of reference images 135 to generate a second set of aligned reference images 135. As noted previously herein, the second set of aligned reference images 135 may include reference images which have been selectively modified and/or adjusted to align the reference die 308d-308g to the master die 306 (and/or training images 125). In embodiments, the controller 104 may be configured to store the second set of aligned reference images 135 in memory.

Figure 4:
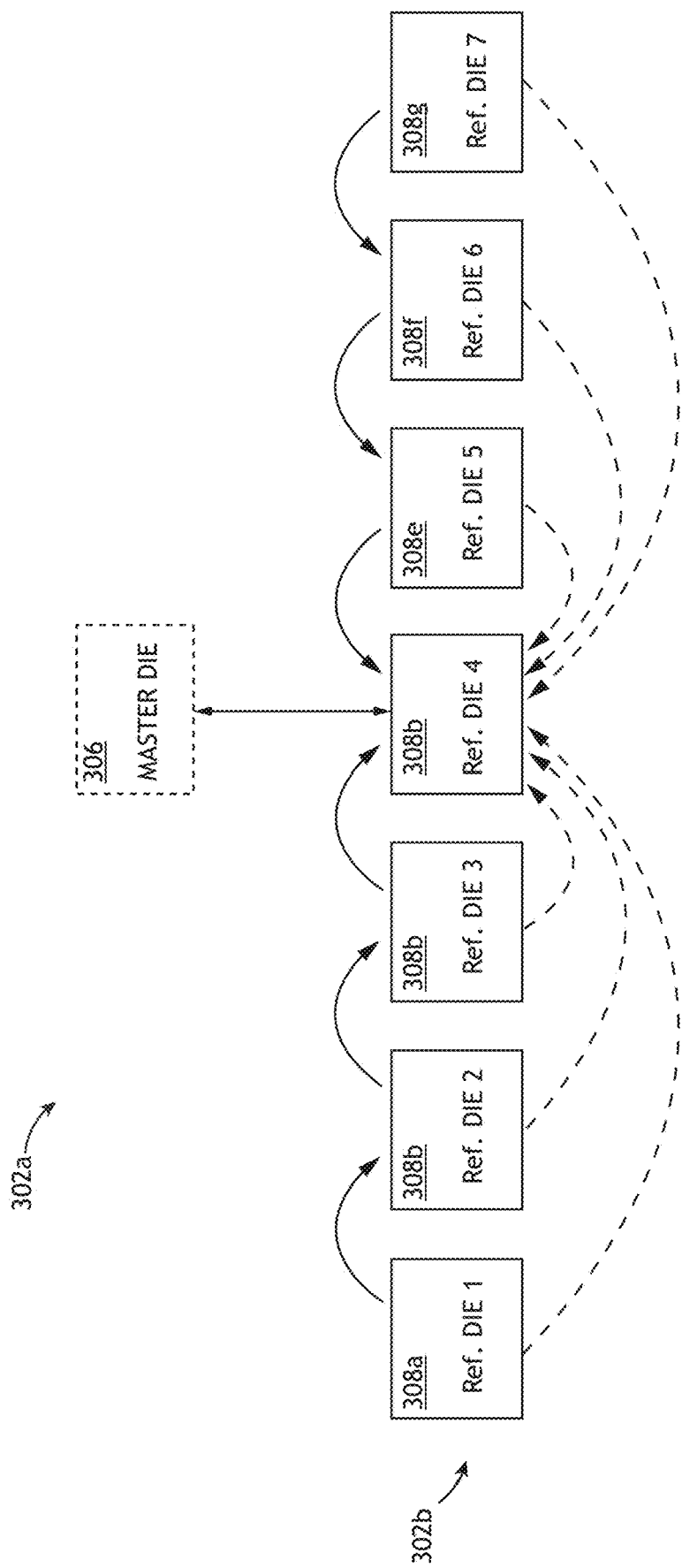
FIG. 4 illustrates a schematic diagram for performing print check alignment of images of a semiconductor device, in accordance with one or more embodiments of the present disclosure.

FIG. 4 illustrates a schematic diagram for performing print check alignment of images of a semiconductor device (sample 120), in accordance with one or more embodiments of the present disclosure. In particular, FIG. 4 illustrates alignment of reference die 308 with a master die 306. As shown in FIG. 4, the controller 104 may be configured to align a plurality of reference die 308 to a master die 306 located in a first die row 302a. The plurality of reference die 308 may be located in a second die row 302b different from the first die row 302a.

As shown in FIG. 4, the controller 104 may be configured to align reference die 308 to a master die 306 by calculating respective offsets between die in the same die row 302b, as well as offsets between die rows 302 (e.g., offset between the second die row 302b and the first die row 302a). For example, in one embodiment, a reference die 308d may be aligned to the master die 306 via coarse alignment processes and fine alignment processes. Subsequently, other die 308 within the same die row 302b as the reference die 308d may be aligned to the reference die 308d via fine alignment processes only. In this regard, by aligning one reference die 308 to the master die 306, other reference die 308 within the same row may not require coarse alignment processes, as fine alignment processes may be utilized to align to the previously-aligned reference die 308d.

In one embodiment, the one or more coarse alignment (or global alignment) processes measures the offset between two images (e.g., reference images 135, training images 125) of the entirety of a swath or select zones of a swath. For example, the coarse alignment process may measure offsets between images from the same scan. By way of another example, the coarse alignment process may measure offsets between a reference image 135 and a training image 125. In another embodiment, the coarse alignment process may measure offsets between images rendered from semiconductor design data and an optical reference image 135.

Due to stage uncertainty (e.g., positional uncertainty of stage assembly 122), alignment offsets across die rows (e.g., from first die row 302a to the second die row 302b) and/or across swath scans may be relatively large, up to approximately ±1 µm. This large offset search range (±1 µm) is typically larger than the range for fine alignment processes. Accordingly, for alignment offsets across die rows 302 and/or across swath scans, both coarse alignment processes and fine alignment processes may be required.

In embodiments, the coarse alignment processes may be configured to align the reference image 135 and the training image 125 to within ±2 pixels (e.g., align the reference die 308 to the master die 306 to within ±2 pixels, based on the training images 125). While this is a relatively low accuracy requirement, the coarse alignment processes used must be robust in that they are consistently (always) able to align the reference die 308 to within ±2 pixels. However, it has been found that conventional coarse alignment techniques are not robust in that they sometimes fail to properly align two images (or reference die 308) to within ±2 pixels. Failure to properly align during coarse alignment may subsequently cause fine alignment processes to fail.

Accordingly, some embodiments of the present disclosure are directed to a coarse alignment process which is more robust (e.g., more consistent) than previous coarse alignment techniques. In particular, embodiments of the present disclosure are directed to a coarse alignment process which is able to always align two images to within ±2 pixels using a relatively small number of alignment targets.

The coarse alignment processes of the present disclosure may be further understood with reference to FIG. 2B. FIG. 2B illustrates a flowchart of a portion of method 200 for performing print check alignment of images of a semiconductor device (e.g., sample 120), in accordance with one or more embodiments of the present disclosure. In particular, FIG. 2B illustrates sub-steps of step 212 for performing coarse alignment processes.

In a step 216, an offset value between the second set of one or more reference images 135 and the one or more training images 125 is determined for each of the one or more alignment targets. For example, for a swath scan of the second die row 302b, the controller 104 may be configured to determine a plurality of offset values across the swath scan relative to a plurality of alignment targets. This may be further understood with reference to FIGS. 5-6.

Figure 5:
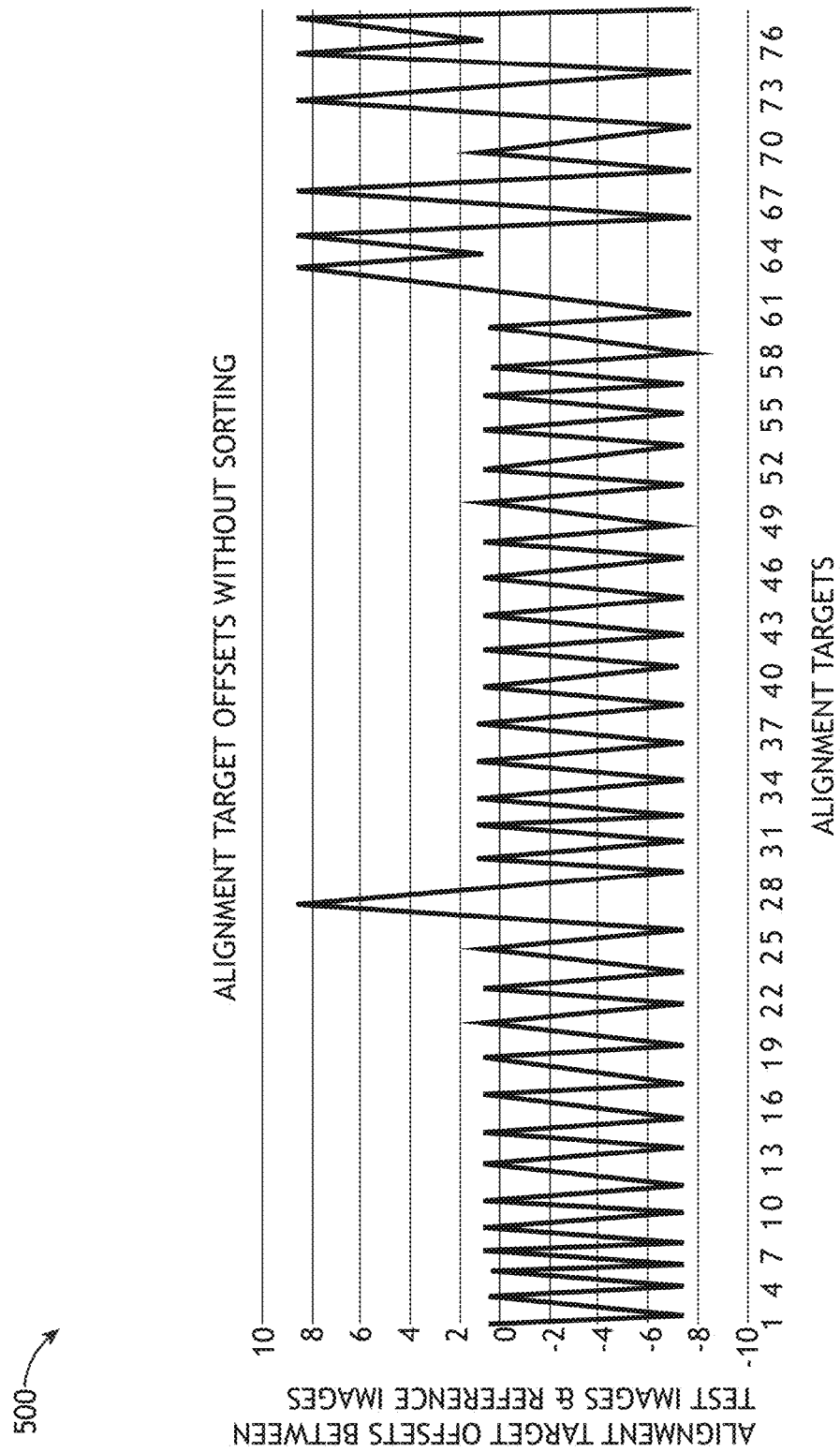
FIG. 5 is a graph illustrating offsets of alignment targets between reference images and training images.

FIG. 5 is a graph 500 illustrating offsets of alignment targets between reference images and training images. In particular, graph 500 illustrates a plurality of alignment targets on the x-axis, and the respective offset of the respective alignment targets between training images and the reference images on the y-axis.

Graph 500 illustrates offsets measured from multiple alignment targets between respective die (e.g., reference die 308, test die) and the master die 306. The offsets of the die illustrated in graph 500 may be from swath scans which are different from the swath scans of the master die 306. The different swaths may be from the same scan of a sample 120, but of differing die rows 302 as compared to the master die 306. In additional and/or alternative embodiments, different swaths may be from the scans of separate samples 120a, 120b.

The alignment targets may be arranged on the x-axis as a function of position on the sample 120 and/or master die 306 over a single swath scan. As shown by graph 500, there is no clearly defined offset across the alignment targets. There is a first set of alignment targets which exhibit an offset between 0 and 1, whereas a second set of alignment targets exhibit an offset of approximately −8. Conventional alignment clustering algorithms may be unable to correctly determine which coarse alignment offset should be selected. Accordingly, a conventional coarse alignment clustering algorithm would likely fail to identify a coarse alignment offset for the set of alignment targets.

Embodiments of the present disclosure may enable the system 100 and method 200 to address the shortfalls of previous coarse alignment processes shown in graph 500. For example, embodiments of the present disclosure may organize and/or sort offset values not according to relative position within a swath scan, but according to other values associated with each alignment target, such as normalized cross correlation (NCC) values, sum squared difference (SSD) values, and the like.

For example, in a step 218, the controller 104 may calculate a normalized cross correlation (NCC) value for each of the one or more alignment targets. For instance, the controller 104 may calculate an NCC value for each of the alignment targets (e.g., alignment targets 1-79) pictured along the x-axis of graph 500. The controller 104 may be configured to calculate the NCC values using any mathematical technique or algorithm known in the art. In embodiments, the controller 104 may store the NCC values and associated alignment targets in memory 108.

In a step 220, the controller 104 may be configured to arrange and/or sort the alignment targets according to their associated NCC scores. For example, the controller 104 may be configured to generate a sorted list of the one or more alignment targets according to the associated NCC values, where the alignment targets are organized within the sorted list from largest NCC score to smallest NCC score. This may be further understood with reference to FIG. 6.

Figure 6:
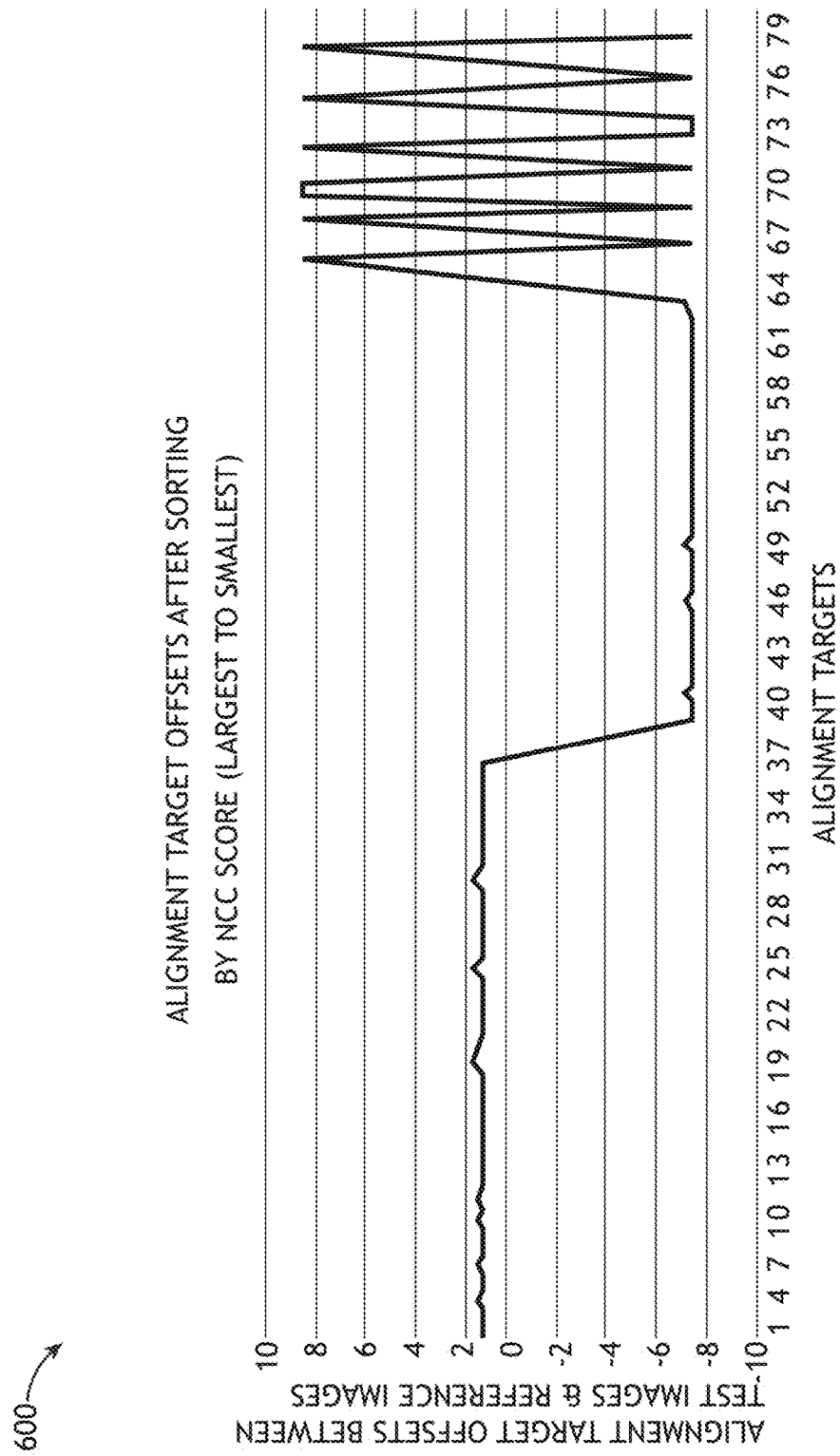
FIG. 6 is a graph illustrating offsets of alignment targets between reference images and training images after sorting based on normalized cross correlation (NCC), in accordance with one or more embodiments of the present disclosure.

FIG. 6 is a graph 600 illustrating offsets of alignment targets between reference images 135 and training images 125 after sorting based on normalized cross correlation (NCC), in accordance with one or more embodiments of the present disclosure.

Once again, graph 600 illustrates a plurality of alignment targets on the x-axis, and the respective offset of the respective alignment targets between training images and the reference images on the y-axis. However, as compared to FIG. 5, graph 600 organizes alignment targets and respective offsets according to the NCC value of each respective alignment target. For example, the controller 104 may be configured to calculate an NCC value for each respective alignment target, save the associated NCC values in memory 108, and then arrange the alignment targets according to the determined NCC values. For instance, the alignment targets on the x-axis of graph 600 may be organized from largest to smallest NCC value (largest along y-axis, with NCC values getting smaller as you move along x-axis).

As shown graph 600, arranging the alignment targets according to NCC value may result in more defined offset trends as compared to graph 500. For example, by arranging the alignment targets according to NCC value, it may be seen that there is a first set of alignment targets which exhibit an offset between 0 and 2, and a second set of alignment targets which exhibit an offset between −6 and −8.

In a step 222, the controller 104 may be configured to identify one or more clusters of alignment targets in the sorted list which exhibit offset values within a selected range of one another. In other words, the controller 104 may be configured to identify one or more clusters of alignment targets, when organized by NCC score, which exhibit similar offset values. The selected range used to determine clusters of alignment targets may be selected automatically and/or manually by the controller 104 and/or a user (via user interface 110). For example, a smaller selected range may require alignment targets to exhibit smaller offset value deviations from one another to be grouped into a single cluster, whereas a larger selected range may allow alignment targets to exhibit larger offset value deviations from one another to be grouped into a single cluster, In some embodiments, the controller 104 may be configured to select a coarse alignment offset value (e.g., robust coarse alignment offset value) which corresponds to a first cluster of alignment offsets which exhibit similar offset values. For example, as shown in FIG. 6, the controller 104 may be configured to identify a first set of alignment targets which exhibit similar offsets between 0 and 2, and may therefore identify at least a portion of the first set of alignment offsets as a "first cluster." By way of another example, the controller 104 may be configured to identify a second cluster of alignment targets which exhibit similar offsets between −6 and −8, and may therefore identify at least a portion of the second set of alignment offsets as a "second cluster."

In a step 224, the controller 104 may be configured to determine a coarse alignment offset value based on the offset values of the identified cluster of alignment targets. For example, if only one cluster of alignment targets with similar offset values were identified, the controller 104 may be configured to determine the coarse alignment offset value for the respective swath scan based on the offset values of the identified cluster. For instance, the determined coarse alignment offset value may include a median or average of the offset values associated with the identified cluster of alignment targets.

In embodiments where the controller 104 identifies two or more clusters of alignment targets with similar offset values (e.g., alignment targets exhibiting offset values within a selected range of one another), the controller 104 may be configured to select the cluster of alignment targets with the largest average NCC value as the cluster used to determine the coarse alignment offset value. For example, as shown in graph 600, the controller 104 may be configured to identify a first cluster of alignment values with offset values between 0 and 2, and may be further configured to identify a second cluster of alignment values with offset values between −6 and −8. In this example, the controller 104 may be configured to determine whether the first cluster exhibits a higher average NCC value than the second cluster, and thereby select and/or identify the first cluster as the cluster which will be used to determine the coarse alignment offset value. In this example, the controller 104 may then be configured to determine the coarse alignment offset value as the median or average offset value of the first cluster (e.g., median or average of the offset values between 0 and 1).

While the coarse alignment offset value for a swath scan (e.g., set of reference images 135 of a die row 302b-302n) is described as being calculated by a median or average of an identified cluster, this is not to be regarded as a limitation of the present disclosure, unless noted otherwise herein. For example, upon selecting the first cluster of alignment targets in graph 600, the controller 104 may be configured to use the associated offset values of the first cluster and any mathematical techniques, operations, or algorithms known in the art to determine the coarse alignment offset value based on the associated offset values of the identified cluster.

By selecting an offset value which is associated with a cluster of alignment targets with the highest NCC value, embodiments of the present disclosure may enable accurate determinations of coarse alignment offset values which may not be possible with conventional alignment techniques. Additionally, by calculating a coarse alignment offset value for an entire swath scan or set of reference images 135 of a die row 302b-302n the coarse alignment processes of the present disclosure may be much more robust as compared to conventional coarse alignment processes. For example, when referring to the second set of reference images 135 acquired across the second die row 302b, the controller 104 may be configured to perform steps 216-224 in order to calculate a single robust coarse alignment offset value which will be used for each of the second set of reference images 135. By using the single robust coarse alignment offset value which will be used for each of the second set of reference images 135, it has been found the coarse alignment offset value may always enable the second set of reference images 135 to be aligned within ±2 pixels.

It is noted herein that utilizing a single coarse alignment offset value (as opposed to a plurality of coarse alignment offsets) may result in a coarse alignment process which is slightly less accurate with aligning images as compared to conventional coarse alignment processes. However, it has been found that the coarse alignment processes of the present disclosure are much more robust than traditional processes in that they are always able to achieve alignment within ±2 pixels. Furthermore, due to the fact that the coarse alignment processes will be followed with fine alignment processes, the slight decrease in accuracy is rendered inconsequential. Accordingly, the coarse alignment processes of the present disclosure enable more robust coarse alignment, while maintaining the same overall accuracy following fine alignment.

While steps 216-224 are shown and described as determining a coarse alignment offset value based on NCC values, this is not to be regarded as a limitation of the present disclosure, unless noted otherwise herein. For example, steps 216-224 may be carried out according to SSD values. For instance, in some embodiments, the controller 104 may be configured to carry out steps 216-224 by: determining an offset value between the second set of one or more reference images 135 and the one or more training images 125 for each of the one or more alignment targets; calculate a sum squared difference (SSD) value for each of the one or more alignment targets; generate a sorted list of the one or more alignment targets according to the associated SSD values from smallest to largest (as shown in FIG. 6); identify a cluster of alignment targets in the sorted list which exhibit offset values within a selected range of one another; and determine the coarse alignment offset value based on the offset values of the identified cluster of alignment targets.

Following coarse alignment in step 212, method 200 may proceed to fine alignment in step 214. In a step 214, the second set of one or more reference die 308 are aligned to the master die 306 via a fine alignment process to generate a second set of one or more aligned reference images of the second die row 302b. In embodiments, the controller 104 may be configured to store the second set of one or more aligned reference images 135 in memory 108.

In embodiments, the fine alignment processes carried out in step 214 may utilize the robust coarse alignment offset value (which aligns images within ±2 pixels) and a smaller search range (±1-3 pixels) in order to refine the alignment and align the reference images 135 to within ±0.05 pixels. In this regard, the fine alignment process may utilize a greater number of targets than the coarse alignment process. Additionally, due to the smaller search range, a greater number of targets are usable for the fine alignment process than for the coarse alignment process. For example, the targets may include, but are not limited to, targets on repeating patterns in an array structure.

In embodiments, the fine alignment process corrects individual offset data. In another embodiment, the fine alignment process measures residual offsets between the reference images 135 and the training image 125. The fine alignment processes may produce more accurate image offsets than a coarse alignment process. For example, the fine alignment process may align the reference images 135 and the training images 125 with an alignment accuracy of ±0.05 pixels (3 sigma) anywhere on sample 120, while the coarse alignment process may align the reference images 135 and the training images 125 with only an alignment accuracy of ±one pixel (3 sigma) anywhere on the sample 120.

As shown in FIG. 4, the controller 104 may perform one or more fine alignment processes which utilize the determined robust coarse alignment offset value for the die row 302b, refine the robust coarse alignment offset value for the respective die row 302b, then selectively modify the reference images 135 associated with the die row 302b to generate a set of aligned reference images 135.

By way of example, the controller 104 may be configured to align the second set of one or more reference die 308d-308g to the master die 306 via a fine alignment process by measuring a plurality of individual offsets of the one or more alignment targets between the second set of one or more reference images 135 and the one or more training images 125. In this example, the controller 104 may be configured to align the second set of one or more reference die 308d-308g to the master die 306 via a fine alignment process by adjusting the measured plurality of individual offsets to correct distortion.

While method 200 is shown and described as generating sets of aligned reference images only for the first die row 302a and the second die row 302b, this is not to be regarded as a limitation of the present disclosure, unless noted otherwise herein. In this regard, the controller 104 may be configured to perform steps 210-214 and/or steps 216-224 for any number of die rows 302n and/or swath scans.

For example, referring to a third die row 302c including a third set of reference die 308h, 308i, 308j, 308k, the controller 104 may be configured to: receive a third set of one or more reference images 135 of the third die row 302c of the sample 120; align the third set of one or more reference die 308h-308k to the master die 306 based on the alignment targets and the one or more training images 125 using a course alignment offset value (which may be calculated according to steps 216-224); and align the third set of one or more reference die 308h-308k to the master die 306 via a fine alignment process to generate a third set of one or more aligned reference images 135 of the third die row 302c. This process may be repeated for each die row 302b-302n of the sample 120.

It is noted herein that the robust coarse alignment offset values may vary between die rows 302 and/or swath scans. For example, the coarse alignment offset value utilized to align (e.g., correct, modify) the second die row 302b may be different than the coarse alignment offset value utilized to align (e.g., correct, modify) the third die row 302c.

After generating sets of aligned reference images 135 (e.g., first set of aligned reference images 135 associated with the first die row 302a, second set of aligned reference images 135 associated with the second die row 302b, and the like), the controller 104 may be configured to compare the aligned reference images 135 to the training images 125 in order to determine one or more characteristics of the sample 120. For example, the controller 104 may be configured to determine one or more characteristics of the sample 120 from which the reference images 135 were acquired based on one or more differences between the one or more training images 125 and the stored aligned reference images 135 associated with any of the die rows 302 and/or swath scans of the sample 120. The characteristics of the sample 120 which may be determined may include any characteristics known in the art including, but not limited to, types of defects, position of defects, critical dimensions, measurements, and the like.

In some embodiments, the controller 104 may be further configured to generate control signals based on determined characteristics of the sample 120, where the one or more control signals are configured to selectively adjust one or more characteristics of one or more process tools. For example, referring to FIG. 1, the system 100 may further include one or more fabrication tools communicatively coupled to the controller 104. The one or more fabrication tools may include any fabrication tool known in the art configured to inspect and/or fabricate a sample 120 including, but not limited to, a lithography tool, an etching tool, a deposition tool, a polishing tool, and the like. Continuing with the same example, the controller 104 may be configured to generate one or more control signals configured to adjust one or more characteristics of one or more fabrication tools in a feed-forward or a feed-back loop based on the determined characteristics of the sample 120. The feed-forward and/or feed-back loops may be initiated to correct for one or more defects of the sample 120 identified by the controller 104.

Figure 7A:
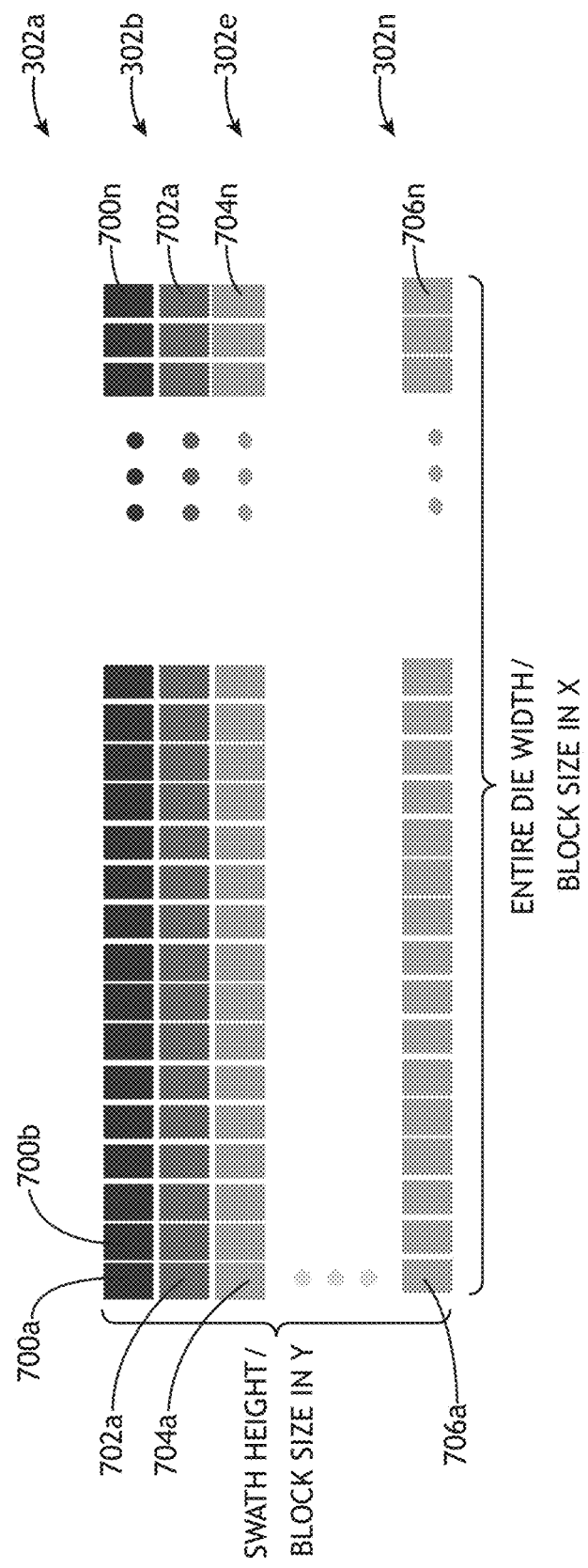
FIG. 7A illustrates a swath of images divided into small blocks for fine alignment processes, in accordance with one or more embodiments of the present disclosure.

FIG. 7A illustrates a swath of images divided into small blocks for fine alignment processes, in accordance with one or more embodiments of the present disclosure. In particular, FIG. 7A illustrates fine alignment offset measurement on swaths of images of a sample 120.

In embodiments, fine alignment may include fine alignment offset measurement, and swath-level fine alignment offset post-processing. When performing the one or more fine alignment processes, the controller 104 may be configured to divide swaths of images of a sample 120 into small blocks. For example, a first swath of images may be acquired for a first row 302a of a sample 120, a second swath of images may be acquired for a second row 302b of a sample 120, a third swath of images may be acquired for a third row 302c of a sample 120, and the like. In this example, each swath (corresponding to the rows 302a-302n) may be divided into a plurality of blocks. The first swath may be divided into blocks 700a-700n, the second swath may be divided into blocks 702a-702n, the third swath may be divided into blocks 704a-704n, and the like.

During fine alignment processes, the controller 104 may be configured to determine fine alignment offsets for each individual block 700, 702, 704, 706. By way of example, where coarse alignment processes may be performed based on alignment targets, fine alignment processes may be performed on each alignment block sized 256×400. In this regard, the controller 104 may be configured to determine a first fine alignment offset value for block 700*a*, a second fine alignment offset value for block 700*b*, and an nth fine alignment offset value for block 706*n*. Fine alignment offset values associated with each individual block may be stored in memory 108. This may be further understood with reference to FIG. 7B.

Figure 7B:
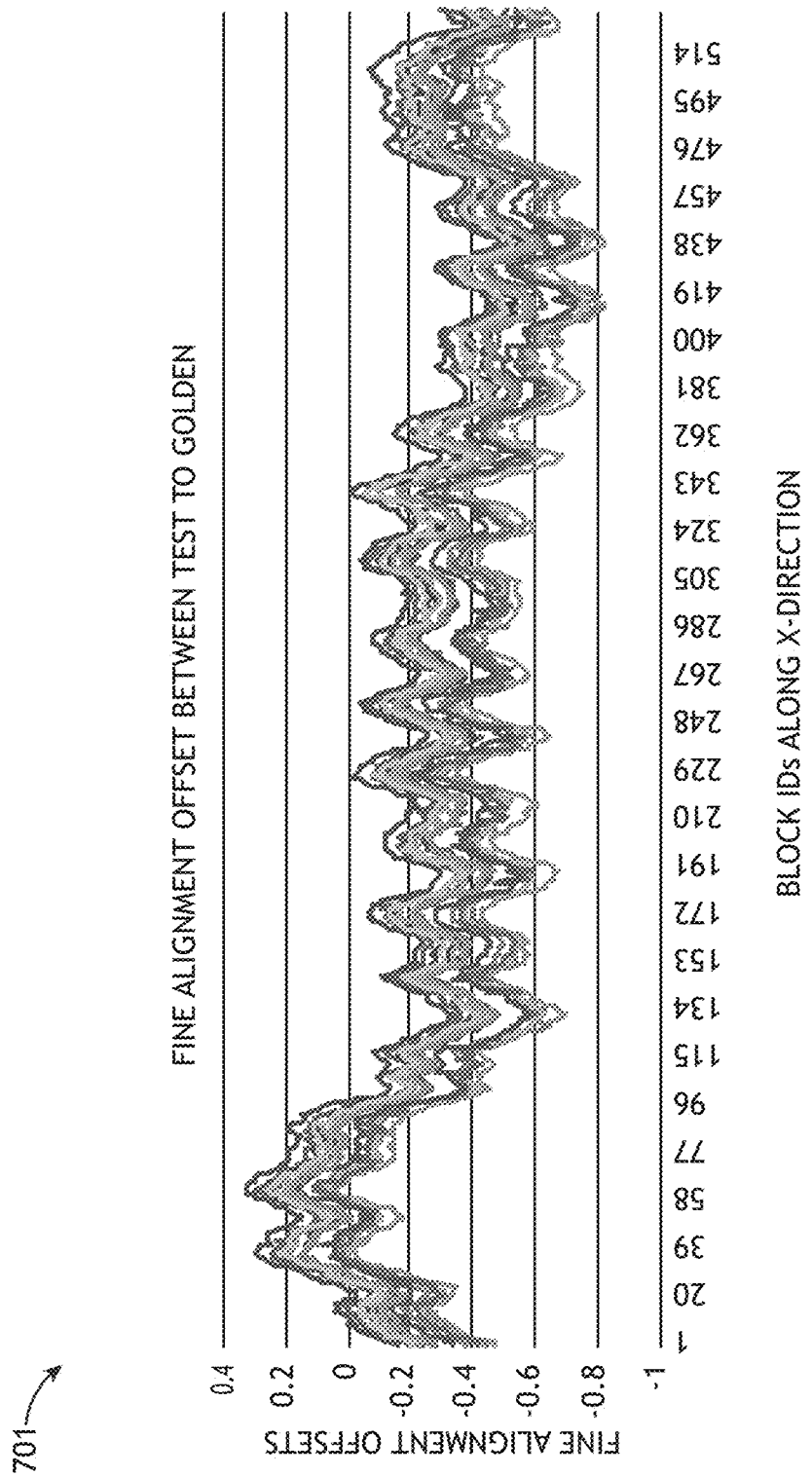
FIG. 7B is a graph illustrating offsets of alignment targets following fine alignment, in accordance with one or more embodiments of the present disclosure.

FIG. 7B is a graph 701 illustrating offsets of alignment targets following fine alignment, in accordance with one or more embodiments of the present disclosure. In particular, graph 701 illustrates block IDs shown in FIG. 7A along the x-axis, and corresponding fine alignment offsets associated with each block along the y-axis.

After determining fine alignment offset values for each respective block, the controller 104 may be configured to graph the determined fine alignment offset values against the blocks, as shown in graph 701. As shown in graph 701, the fine alignment offset differences along Y for a constant X value are consistent across different X values. It is noted herein that offsets for some blocks can not be measured, or may be measured incorrectly due to an absence of features (e.g., alignment targets) along the X and/or Y-direction. This may be further understood with reference to FIGS. 8-10.

Figure 8:
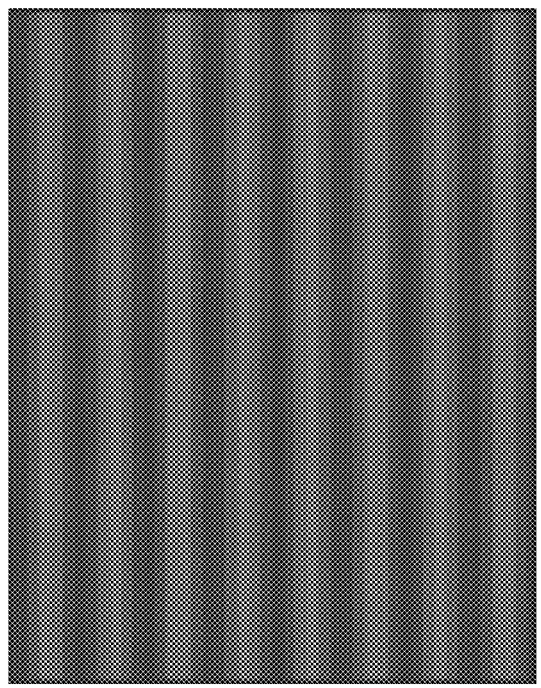
FIG. 8 illustrates an image of a sample, in accordance with one or more embodiments of the present disclosure.

FIG. 8 illustrates an image 135 of a sample 120, in accordance with one or more embodiments of the present disclosure. As shown in FIG. 8, the entire frame of the image 135 may include only horizontal features ("stripes"), with no discernable vertical features. Conventional alignment techniques may be unable to align reference images and test images along the X-direction due to this lack of vertical features.

Figure 9:
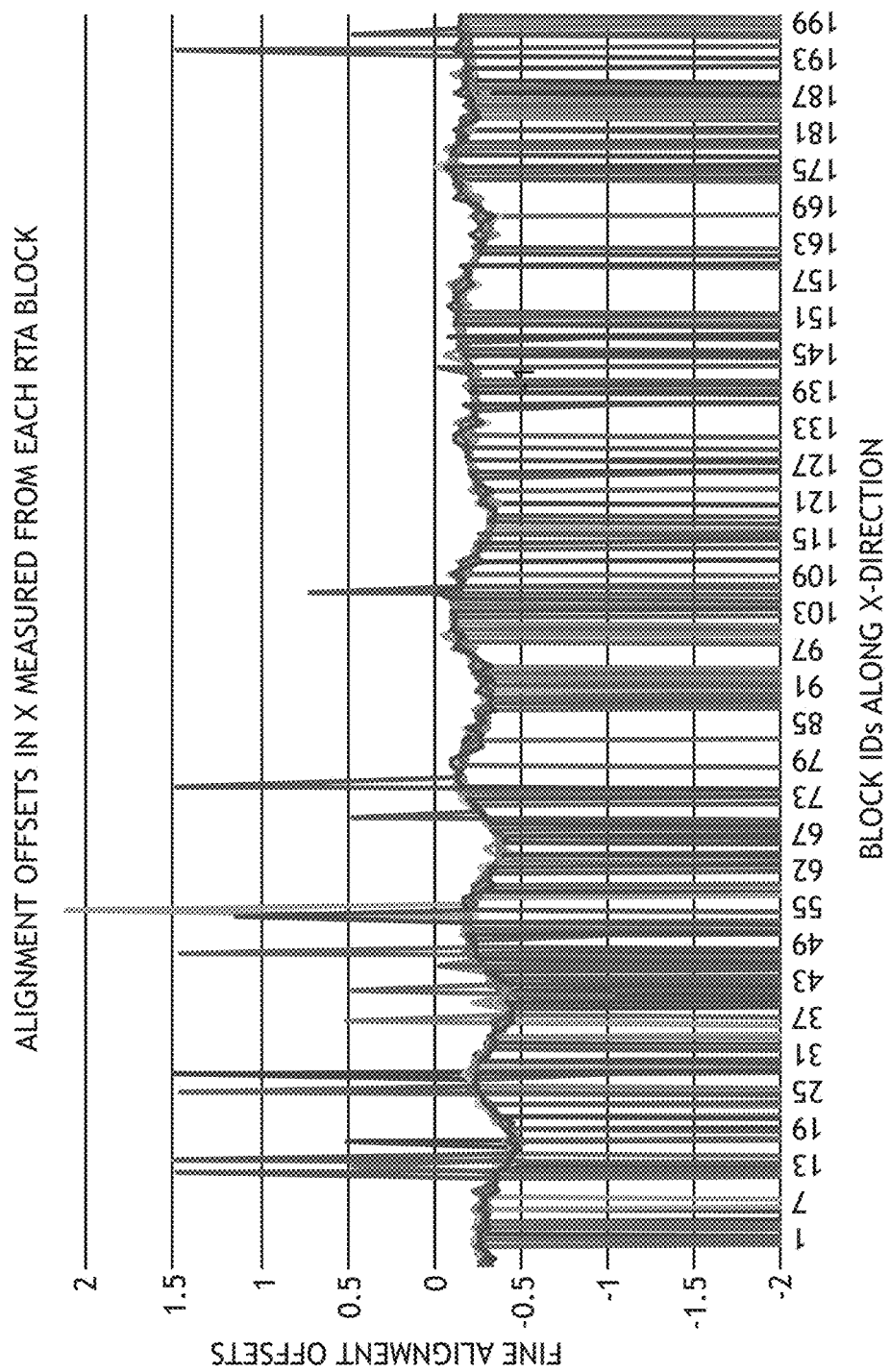
FIG. 9 is a graph illustrating offsets measured using alignment blocks including the image in FIG. 8 in the x-direction.

For example, FIG. 9 is a graph 900 illustrating offsets measured using alignment blocks including the image in FIG. 8 in the X-direction. The multiple spikes upward and downward in FIG. 9 indicate incorrect offsets, or offsets which can't be accurately measured from alignment targets, such as those along the x-direction in FIG. 8. Accordingly, the multiple spikes in FIG. 9 indicate that conventional alignment techniques may be unable to effectively determine fine alignment offset values for each block (e.g., block 700, 702, 704, 706) along the X-direction.

Figure 10:
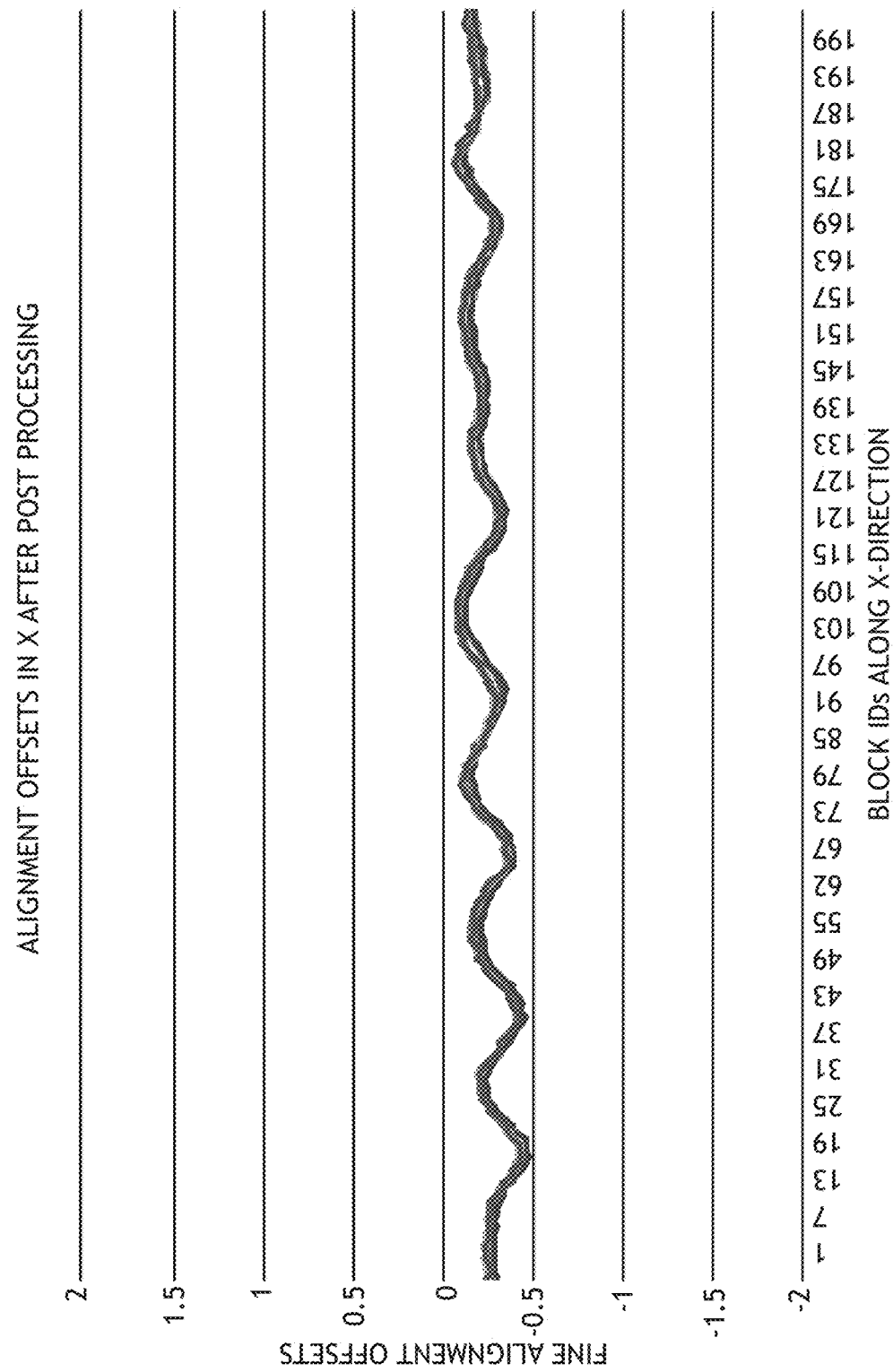
FIG. 10 is a graph illustrating offsets of alignment blocks including the image in FIG. 8 in the x-direction after swath level post processing, in accordance with one or more embodiments of the present disclosure.

Comparatively, FIG. 10 is a graph 1000 illustrating offsets of alignment targets of the image in FIG. 8 in the x-direction after swath level post processing, in accordance with one or more embodiments of the present disclosure. In this regard, graph 1000 may illustrate the results of coarse and fine alignment of the image 135 illustrated in FIG. 8, as carried out by system 100 and/or method 200. As shown in FIG. 10, the swath level fine alignment processes may eliminate incorrect offsets illustrated in FIG. 9 and replace the incorrect offsets with more accurate, correct offsets.

Comparing graph 1000 to graph 900, it may be seen that embodiments of the present disclosure may enable accurate determinations of fine alignment offsets for blocks along the X-direction. By utilizing neighboring frames within a swath of images, the system 100 and method 200 of the present disclosure may enable more accurate and robust offset determinations even in the absence of identifying features.

Figure 11:
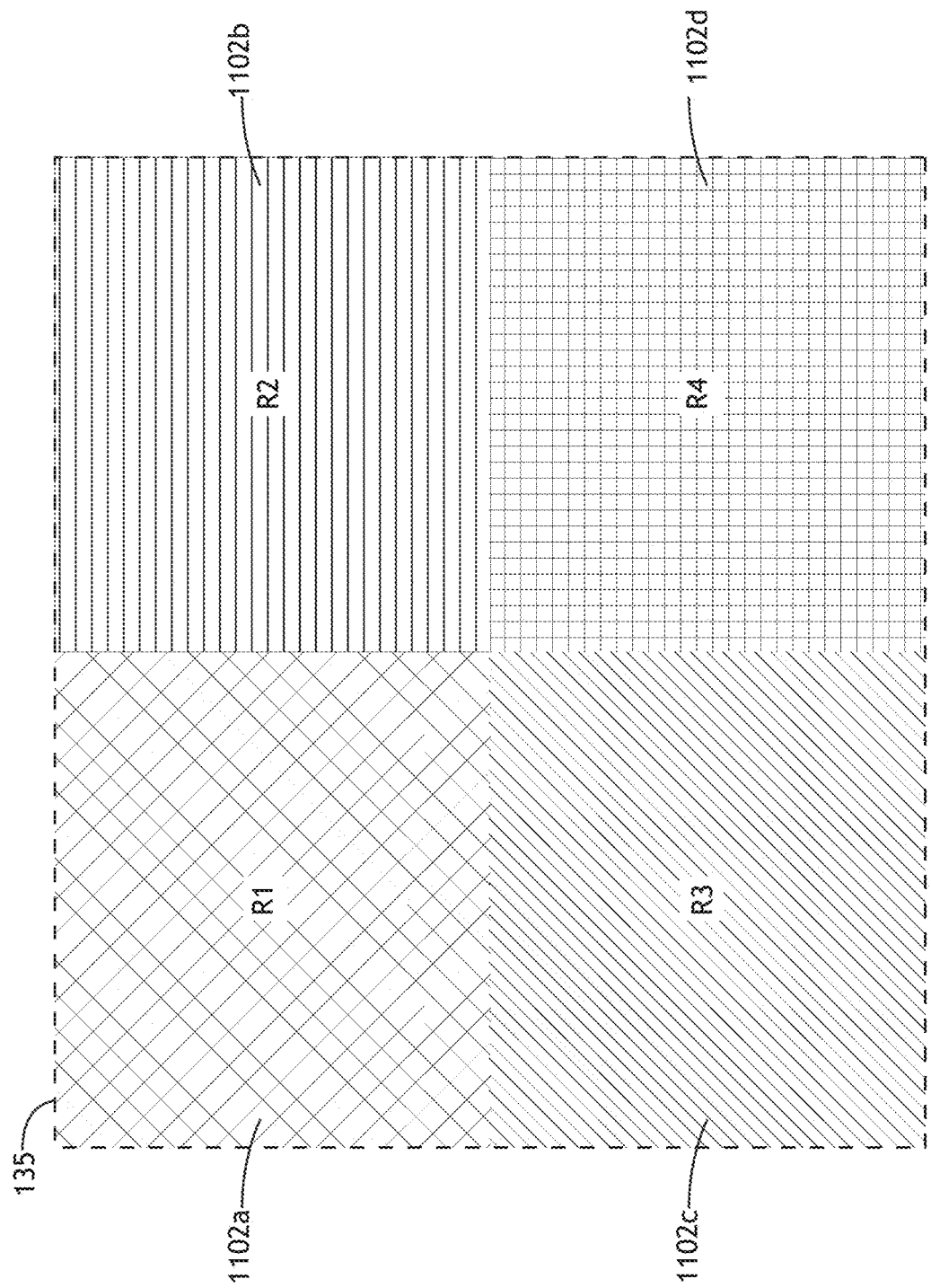
FIG. 11 illustrates a stability of regions within an optical image of a semiconductor device, in accordance with one or more embodiments of the present disclosure.

FIG. 11 illustrates a plurality of regions 1102*a*, 1102*b*, 1102*c*, 1102*d* within an optical image 135 of a semiconductor device, in accordance with one or more embodiments of the present disclosure. More particularly, FIG. 11 illustrates stability of regions between different scans. As it is used herein, the term "stability of regions" refers to the case where the same pixel (e.g., same die-relative location) falls within the same region across multiple scans.

When inspecting for defects or other features of a sample 120, a sample 120 and/or images 135 of the sample 120 may be sub-divided up into a plurality of regions. For instance, an image 135 may be divided up into quadrants including a first region 1102*a*, a second region 1102*b*, a third region 1102*c*, and a fourth region 1102*d*. In order to facilitate and expedite inspection a controller 104 may be configured to inspect for particular defects within a particular region 1102. Accordingly, it is important that pixels associated with positions on the sample 120 are classified/grouped into the correct region 1102.

As noted previously herein, conventional alignment techniques may result in scan-to-scan variation, which may cause the same pixel within to fall into different regions 1102 during different scans (without pattern-to-design alignment (PDA)). For example, using conventional alignment techniques, a pixel associated with a position on the sample 120 may be placed in the first region 1102*a* during a first scan. Subsequently, during a second scan, the pixel associated with the same position on the sample 120 may be placed in the third region 1102*c*. This may result in the failure to identify features or defects on the sample 120.

Comparatively, embodiments of the present disclosure may ensure each reference die 308 is aligned to the master die 306 from different scans. For example, a pixel within the first region 1102*a* will always fall into the first region 1102*a* across scans, a pixel within the third region 1102*c* will always fall into the third region 1102*c* across scans, and the like. For each scan, every die is aligned to master die 306 (saved during training scan) so that pixel level region placement can be consistent from scan to scan. The same pixel (on the same die relative location) can be assigned to the same region from different scans. By saving the position of the master die 306 in memory, and aligning each reference die 308 to the master die 306, embodiments of the present disclosure may ensure the pixels (e.g., defect pixels) will fall into the same region 1102 from scan to scan. Accordingly, the system 100 and method 200 of the present disclosure may ensure each scan results in the same reticle-relative coordinate accuracy, thereby reducing scan-to-scan variation.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodie of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although particular embodiments of this invention have been illustrated, it is apparent that various modifications and embodiments of the invention may be made by those skilled in the art without departing from the scope and spirit of the foregoing disclosure. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

What is claimed:
1. A system, comprising:
a controller communicatively coupled to an optical inspection sub-system, the controller including one or more processors configured to execute a set of program instructions stored in memory, the set of program instructions configured to cause the one or more processors to:
receive one or more training images of a sample, the sample including a master die;
identify one or more alignment targets in the master die and store the one or more alignment targets in memory;
receive a first set of one or more reference images of a first die row of a sample, the first die row including a master die and a first set of one or more reference die;

align the first set of one or more reference die to the master die via one or more alignment processes to generate a first set of one or more aligned reference images of the first row;

receive a second set of one or more reference images of a second die row of the sample, the second die row including a second set of one or more reference die;

align the second set of one or more reference die to the master die based on the alignment targets and the one or more training images using a course alignment offset value; and align the second set of one or more reference die to the master die via the one or more alignment processes to generate a second set of one or more aligned reference images of the second die row.

2. The system in claim 1, determine one or more characteristics of the sample based on one or more differences between the one or more training images and at least one of the first set of one or more aligned reference images or the second set of one or more aligned reference images.

3. The system in claim 2, wherein the one or more characteristics of the sample comprise one or more defects of the sample.

4. The system in claim 1, wherein the controller is configured to determine the coarse alignment offset value by:

determining an offset value between the second set of one or more reference images and the one or more training images for each of the one or more alignment targets;

calculating a normalized cross correlation (NCC) value for each of the one or more alignment targets;

generating a sorted list of the one or more alignment targets according to the associated NCC values from largest to smallest;

identifying a cluster of alignment targets in the sorted list which exhibit offset values within a selected range of one another; and determining the coarse alignment offset value based on the offset values of the identified cluster of alignment targets.

5. The system in claim 4, wherein determining the coarse alignment offset value based on the offset values of the identified cluster of alignment targets comprises:

determining at least one of a median or a mean of the offset values of the identified cluster of alignment targets.

6. The system in claim 4, wherein identifying a cluster of alignment targets in the sorted list which exhibit offset values within a selected range of one another comprises:

identifying a two or more clusters of alignment targets in the sorted list which exhibit offset values within a selected range of one another; and identifying the cluster of alignment targets with the largest average NCC value.

7. The system in claim 1, wherein the controller is configured to determine the coarse alignment offset value by:

determining an offset value between the second set of one or more reference images and the one or more training images for each of the one or more alignment targets;

calculating a sum squared difference (SSD) value for each of the one or more alignment targets;

generating a sorted list of the one or more alignment targets according to the associated SSD values from smallest to largest;

identifying a cluster of alignment targets in the sorted list which exhibit offset values within a selected range of one another; and determining the coarse alignment offset value based on the offset values of the identified cluster of alignment targets.

8. The system in claim 1, wherein the first set of one or more aligned reference images of the first row are stored in memory.

9. The system in claim 1, wherein the second set of one or more aligned reference images of the second row are stored in memory.

10. The system in claim 1, wherein the controller is further configured to:

receive at least one additional set of one or more reference images of at least one additional die row of the sample, the at least one additional die row including at least one additional set of one or more reference die;

align the at least one additional set of one or more reference die to the master die based on the alignment targets and the one or more training images using a course alignment offset value; and align the at least one additional set of one or more reference die to the master die via the one or more alignment processes to generate at least one additional set of one or more aligned reference images of the at least one additional die row.

11. The system in claim 10, wherein the coarse alignment offset value used to align the second die row is different from the coarse alignment offset value used to align the at least one additional die row.

12. The system in claim 1, wherein at least one of the one or more training images, the first set of one or more reference images, or the second set of one or more reference images are received from the optical inspection sub-system.

13. The system in claim 1, wherein the one or more training images are acquired during a scan of a first sample, wherein the first set of one or more reference images are acquired during a first swath scan of a second wafer, and wherein the second set of one or more reference images are acquired during a second swath scan of the second wafer.

14. The system in claim 1, wherein the controller is configured to align the second set of one or more reference die to the master die via the one or more alignment processes by measuring a plurality of individual offsets of the one or more alignment targets between the second set of one or more reference images and the one or more training images.

15. The system in claim 14, wherein the controller is configured to align the second set of one or more reference die to the master die via the one or more alignment processes by adjusting the measured plurality of individual offsets to correct distortion.

16. A system, comprising:

an optical inspection sub-system configured to acquire images of a sample;

a controller communicatively coupled to the optical inspection sub-system, the controller including one or more processors configured to execute a set of program instructions stored in memory, the set of program instructions configured to cause the one or more processors to:

receive one or more training images of a first sample from the optical inspection sub-system, the first sample including a master die;

identify one or more alignment targets in the master die and store the one or more alignment targets in memory;

receive a first set of one or more reference images of a first die row of a second sample from the optical inspection sub-system, the first die row including a master die and a first set of one or more reference die;

align the first set of one or more reference die to the master die via one or more alignment processes to generate a first set of one or more aligned reference images of the first row;

receive a second set of one or more reference images of a second die row of the second sample from the optical inspection sub-system, the second die row including a second set of one or more reference die;

align the second set of one or more reference die to the master die based on the alignment targets and the one or more training images using a course alignment offset value; and align the second set of one or more reference die to the master die via the one or more alignment processes to generate a second set of one or more aligned reference images of the second die row.

17. The system in claim 16, determine one or more characteristics of the second sample based on one or more differences between the one or more training images and at least one of the first set of one or more aligned reference images or the second set of one or more aligned reference images.

18. The system in claim 17, wherein the one or more characteristics of the second sample comprise one or more defects of the second sample.

19. The system in claim 16, wherein the controller is configured to determine the coarse alignment offset value by:

determining an offset value between the second set of one or more reference images and the one or more training images for each of the one or more alignment targets;

calculate a normalized cross correlation (NCC) value for each of the one or more alignment targets;

generate a sorted list of the one or more alignment targets according to the associated NCC values from largest to smallest;

identify a cluster of alignment targets in the sorted list which exhibit offset values within a selected range of one another; and determine the coarse alignment offset value based on the offset values of the identified cluster of alignment targets.

20. The system in claim 19, wherein determining the coarse alignment offset value based on the offset values of the identified cluster of alignment targets comprises:

determining at least one of a median or a mean of the offset values of the identified cluster of alignment targets.

21. The system in claim 19, wherein identifying a cluster of alignment targets in the sorted list which exhibit offset values within a selected range of one another comprises:

identifying a two or more clusters of alignment targets in the sorted list which exhibit offset values within a selected range of one another; and identifying the cluster of alignment targets with the largest average NCC value.

22. The system in claim 16, wherein the controller is configured to determine the coarse alignment offset value by:

determining an offset value between the second set of one or more reference images and the one or more training images for each of the one or more alignment targets;

calculate a sum squared difference (SSD) value for each of the one or more alignment targets;

generate a sorted list of the one or more alignment targets according to the associated SSD values from largest to smallest;

identify a cluster of alignment targets in the sorted list which exhibit offset values within a selected range of one another; and determine the coarse alignment offset value based on the offset values of the identified cluster of alignment targets.

23. The system in claim 16, wherein the controller is further configured to:

receive at least one additional set of one or more reference images of at least one additional die row of the second sample from the optical inspection sub-system, the at least one additional die row including at least one additional set of one or more reference die;

align the at least one additional set of one or more reference die to the master die based on the alignment targets and the one or more training images using a course alignment offset value; and align the at least one additional set of one or more reference die to the master die via the one or more alignment processes to generate at least one additional set of one or more aligned reference images of the at least one additional die row.

24. The system in claim 23, wherein the coarse alignment offset value used to align the second die row is different from the coarse alignment offset value used to align the at least one additional die row.

25. The system in claim 16, wherein at least one of the one or more training images, the first set of one or more reference images, or the second set of one or more reference images are received from the optical inspection sub-system.

26. The system in claim 16, wherein the controller is configured to align the second set of one or more reference die to the master die via the one or more alignment processes by measuring a plurality of individual offsets of the one or more alignment targets between the second set of one or more reference images and the one or more training images.

27. The system in claim 26, wherein the controller is configured to align the second set of one or more reference die to the master die via the one or more alignment processes by adjusting the measured plurality of individual offsets to correct distortion.

28. A method, comprising:

acquiring one or more training images of a sample, the sample including a master die;

identifying one or more alignment targets in the master die and storing the one or more alignment targets in memory;

acquiring a first set of one or more reference images of a first die row of a sample, the first die row including a master die and a first set of one or more reference die;

aligning the first set of one or more reference die to the master die via one or more alignment processes to generate a first set of one or more aligned reference images of the first row;

acquiring a second set of one or more reference images of a second die row of the sample, the second die row including a second set of one or more reference die;

aligning the second set of one or more reference die to the master die based on the alignment targets and the one or more training images using a course alignment offset value; and aligning the second set of one or more reference die to the master die via the one or more alignment processes to generate a second set of one or more aligned reference images of the second die row.

\* \* \* \* \*